United States Patent
Peng et al.

(10) Patent No.: US 12,079,559 B2
(45) Date of Patent: Sep. 3, 2024

(54) IC DEVICE LAYOUT METHOD

(71) Applicant: TAIWAN SEMICONDUCTOR MANUFACTURING COMPANY, LTD., Hsinchu (TW)

(72) Inventors: Shih-Wei Peng, Hsinchu (TW); Guo-Huei Wu, Hsinchu (TW); Wei-Cheng Lin, Hsinchu (TW); Hui-Zhong Zhuang, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/362,889

(22) Filed: Jul. 31, 2023

(65) Prior Publication Data
US 2023/0376668 A1 Nov. 23, 2023

Related U.S. Application Data

(62) Division of application No. 17/395,148, filed on Aug. 5, 2021, now Pat. No. 11,783,109, which is a division of application No. 16/836,631, filed on Mar. 31, 2020, now Pat. No. 11,126,775.

(60) Provisional application No. 62/833,476, filed on Apr. 12, 2019.

(51) Int. Cl.
*G06F 30/392* (2020.01)
*G03F 1/36* (2012.01)
*G03F 7/00* (2006.01)
*G06F 30/398* (2020.01)

(52) U.S. Cl.
CPC .............. *G06F 30/392* (2020.01); *G03F 1/36* (2013.01); *G03F 7/70441* (2013.01); *G06F 30/398* (2020.01)

(58) Field of Classification Search
CPC ........ G06F 30/392; G06F 30/398; G03F 1/36; G03F 7/70441
USPC .......................................................... 716/53
See application file for complete search history.

(56) References Cited

U.S. PATENT DOCUMENTS

| | | | |
|---|---|---|---|
| 7,260,442 | B2 | 8/2007 | Hwang et al. |
| 8,492,220 | B2 | 7/2013 | Erickson et al. |
| 9,256,709 | B2 | 2/2016 | Yu et al. |
| 9,837,414 | B1 | 12/2017 | Balakrishnan et al. |

(Continued)

FOREIGN PATENT DOCUMENTS

| | | | | |
|---|---|---|---|---|
| DE | 102020109326 A1 | * | 10/2020 | ............... G03F 1/36 |
| JP | 2015188210 A | * | 10/2015 | ......... H03K 19/1776 |

(Continued)

OTHER PUBLICATIONS

Office Action dated Dec. 28, 2021 for corresponding case No. TW 11021271850. (pp. 1-3).

*Primary Examiner* — Suresh Memula
(74) *Attorney, Agent, or Firm* — Hauptman Ham, LLP

(57) ABSTRACT

A method of generating an IC layout diagram includes overlapping a channel region of an upper transistor of a complementary field-effect transistor (CFET) in an IC layout with a gate region of the CFET, thereby defining a channel overlap region, positioning an isolation region in the IC layout, the isolation region including an entirety of the channel overlap region, intersecting the isolation region with a conductive region, and generating an IC layout diagram based on the IC layout.

20 Claims, 20 Drawing Sheets

(56) References Cited

U.S. PATENT DOCUMENTS

| | | |
|---|---|---|
| 10,090,193 B1 | 10/2018 | Chanemougame et al. |
| 10,304,832 B1 | 5/2019 | Chanemougame et al. |
| 10,840,146 B1 | 11/2020 | Paul et al. |
| 11,126,775 B2 | 9/2021 | Peng et al. |
| 11,342,214 B1* | 5/2022 | Or-Bach ............... H01L 23/481 |
| 11,374,003 B2* | 6/2022 | Wu ..................... H01L 21/8221 |
| 2004/0262692 A1 | 12/2004 | Hareland et al. |
| 2010/0270559 A1* | 10/2010 | Ota ................... H01L 29/66462 |
| | | 257/E21.445 |
| 2011/0084314 A1* | 4/2011 | Or-Bach ............... H01L 29/808 |
| | | 257/209 |
| 2011/0121366 A1* | 5/2011 | Or-Bach ............. H10B 12/053 |
| | | 257/E27.108 |
| 2011/0294290 A1* | 12/2011 | Nakanishi ............. H10B 43/20 |
| | | 438/666 |
| 2014/0040838 A1 | 2/2014 | Liu et al. |
| 2015/0061148 A1 | 3/2015 | Li et al. |
| 2015/0243643 A1 | 8/2015 | Li et al. |
| 2015/0278429 A1 | 10/2015 | Chang |
| 2018/0358374 A1 | 12/2018 | Kim et al. |
| 2018/0374873 A1* | 12/2018 | Becker ................ H01L 23/5283 |
| 2019/0035803 A1 | 1/2019 | Zhang et al. |
| 2019/0088553 A1* | 3/2019 | Van Dal ......... H01L 21/823871 |
| 2019/0096808 A1 | 3/2019 | Tsutsumi et al. |
| 2019/0214432 A1* | 7/2019 | Kim ....................... H10N 50/01 |
| 2020/0082052 A1* | 3/2020 | Chien ....................... G03F 1/36 |
| 2020/0105660 A1* | 4/2020 | Sio ........................ H01L 23/485 |
| 2020/0235013 A1 | 7/2020 | Lilak et al. |
| 2020/0286900 A1 | 9/2020 | Mann et al. |
| 2020/0328212 A1 | 10/2020 | Wu et al. |
| 2021/0050360 A1 | 2/2021 | Kai et al. |
| 2021/0098483 A1 | 4/2021 | Kang et al. |
| 2022/0037312 A1* | 2/2022 | Kang ................. H01L 27/0629 |

FOREIGN PATENT DOCUMENTS

| | | | |
|---|---|---|---|
| KR | 20160102777 | 8/2016 | |
| KR | 20190032150 | 3/2019 | |
| TW | 1642141 | 11/2018 | |
| TW | 201909413 | 3/2019 | |
| WO | WO2010049158 | 5/2010 | |
| WO | WO-2010049158 A2 * | 5/2010 | ........ H01J 37/32009 |

\* cited by examiner

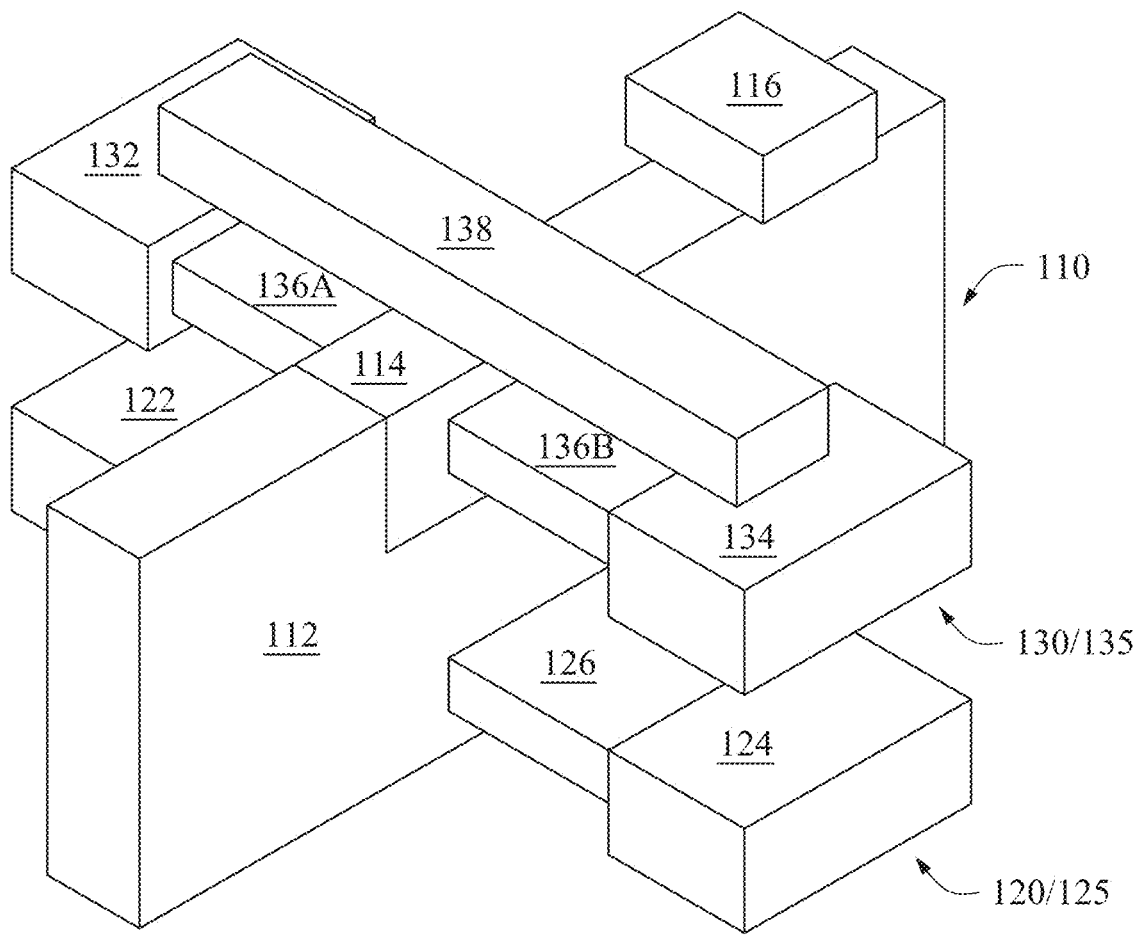
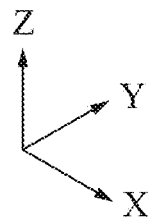
FIG. 1A

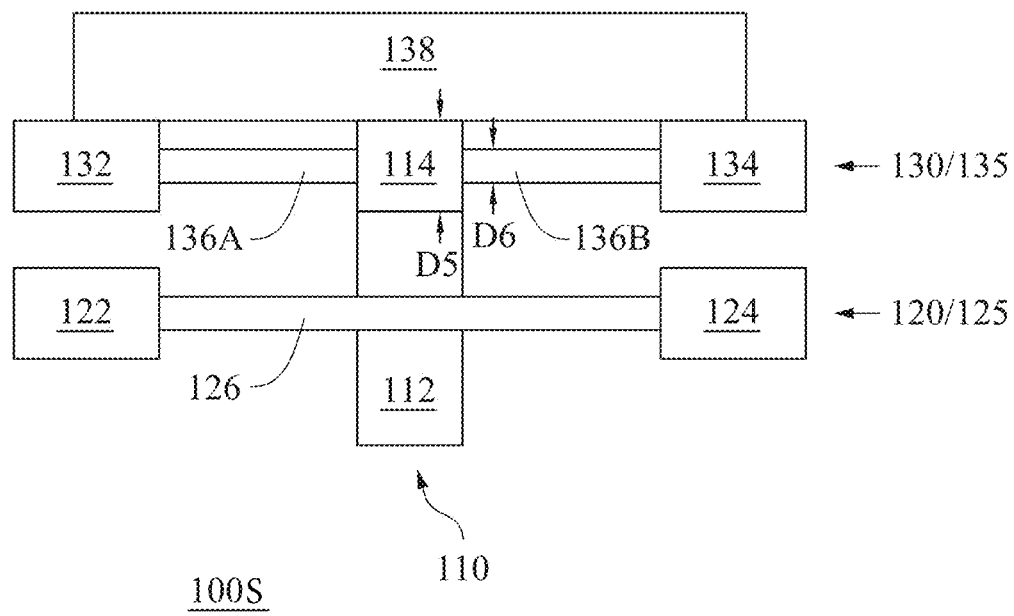
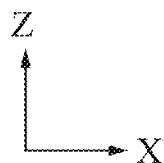
FIG. 1C

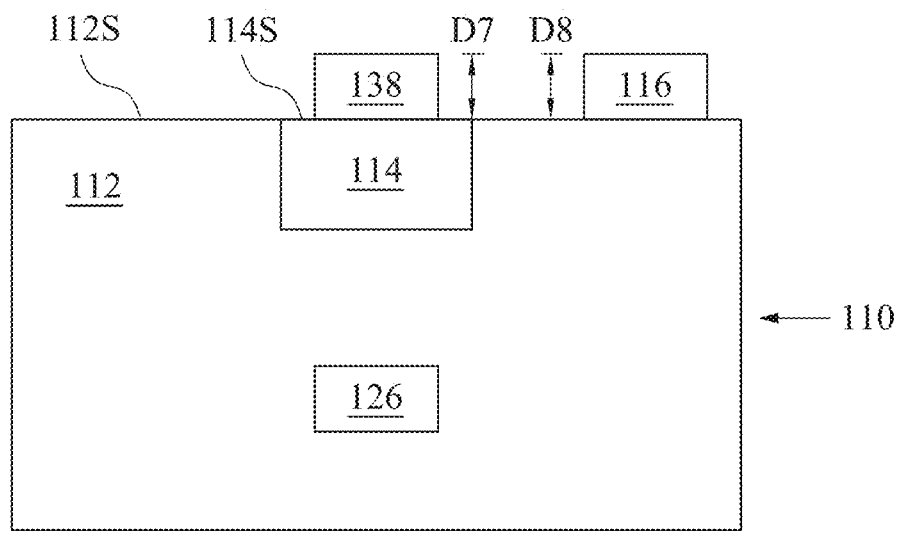
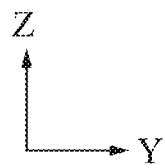
FIG. 1D

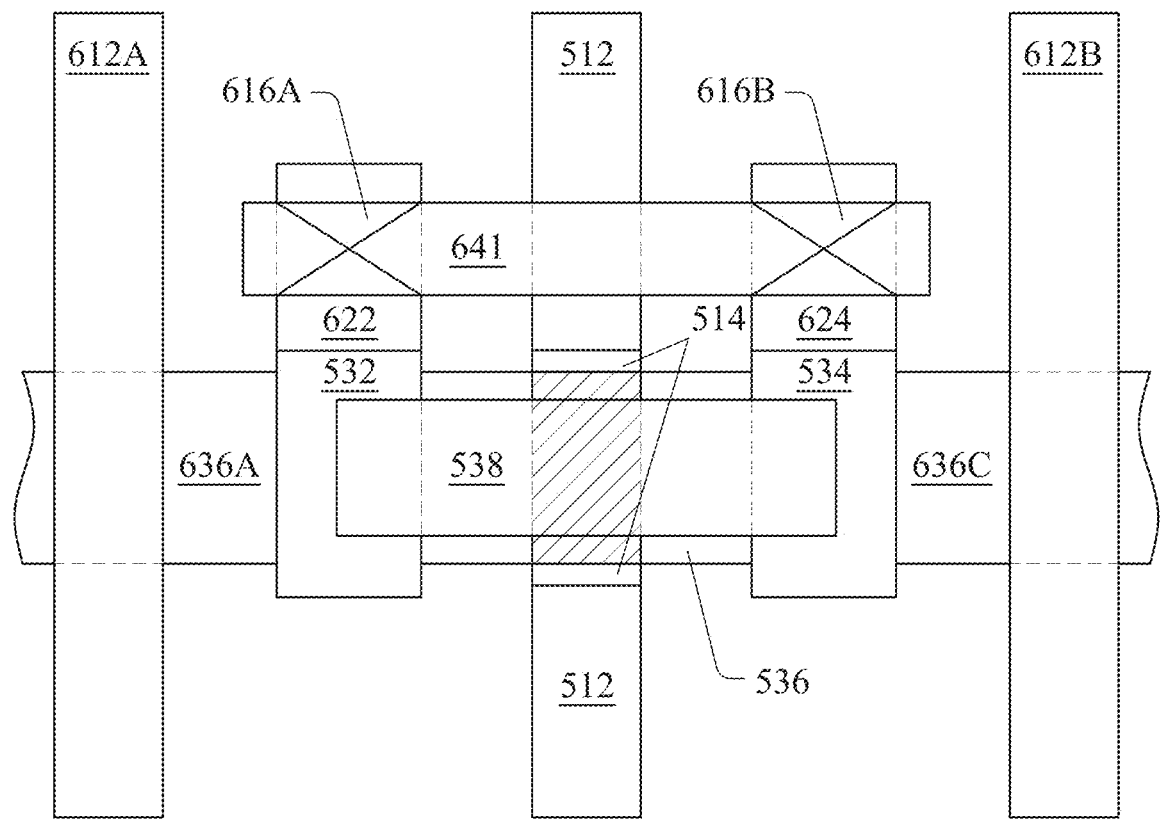
FIG. 6A1

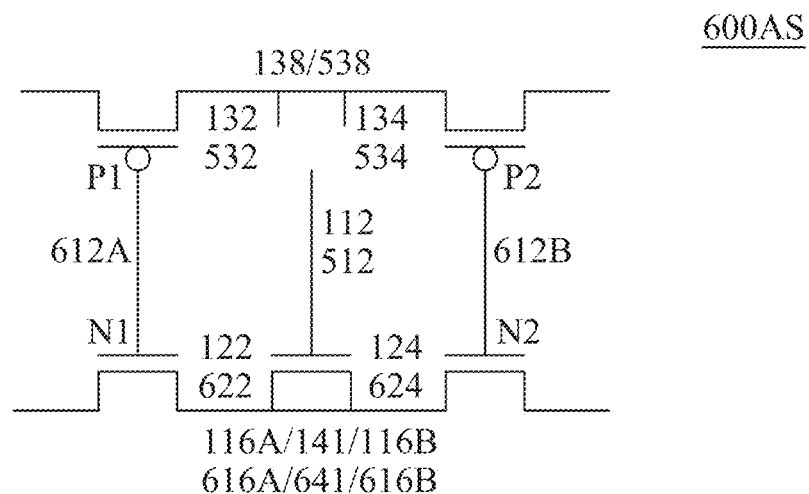
FIG. 6A2
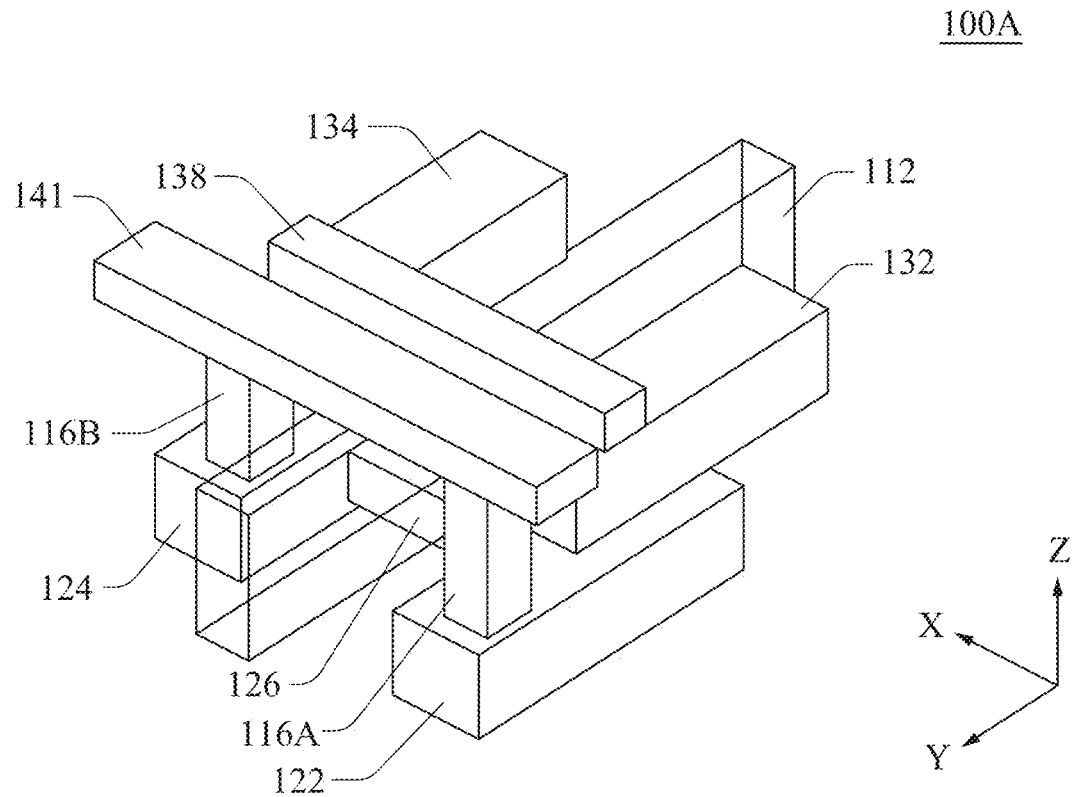
FIG. 6A3

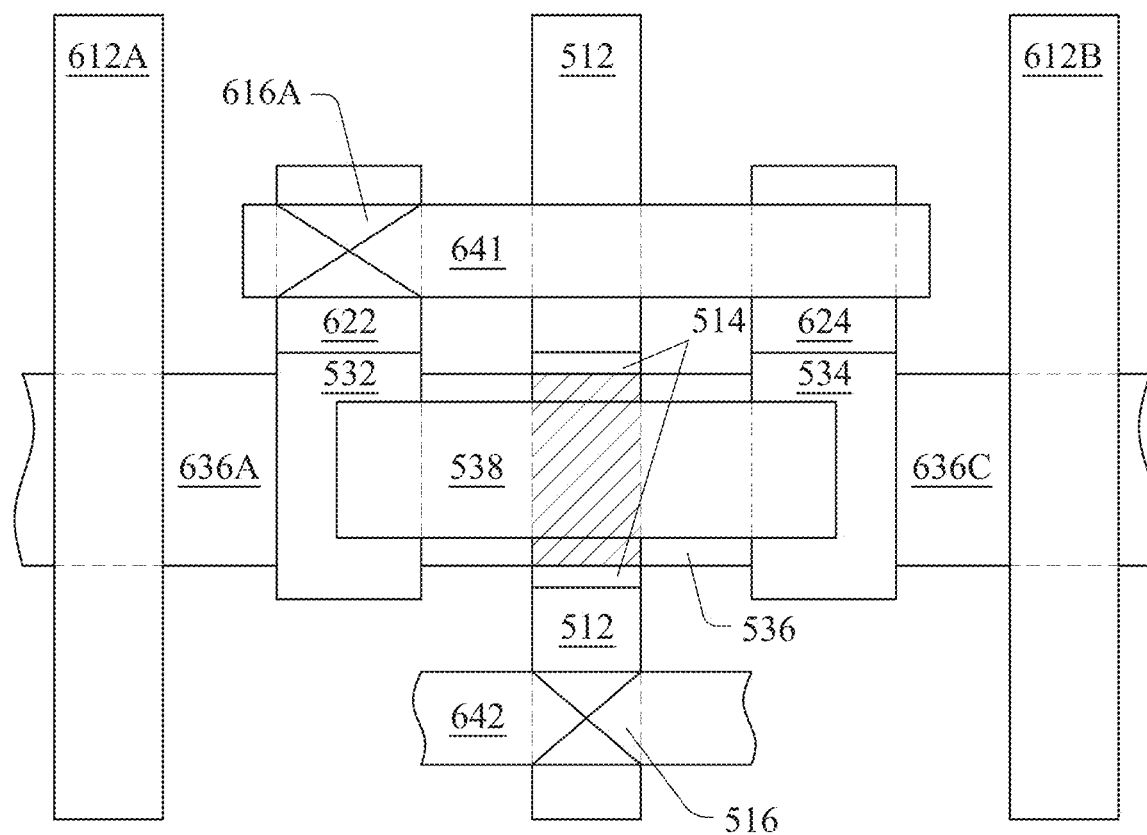
FIG. 6B1

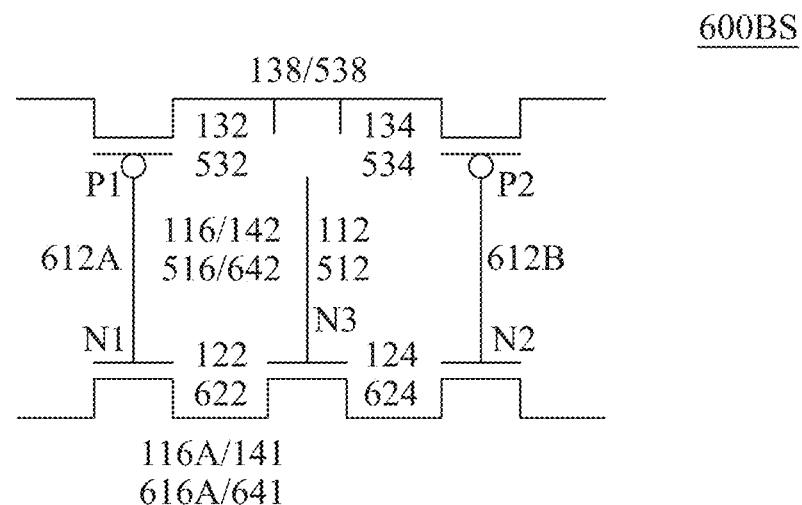
FIG. 6B2
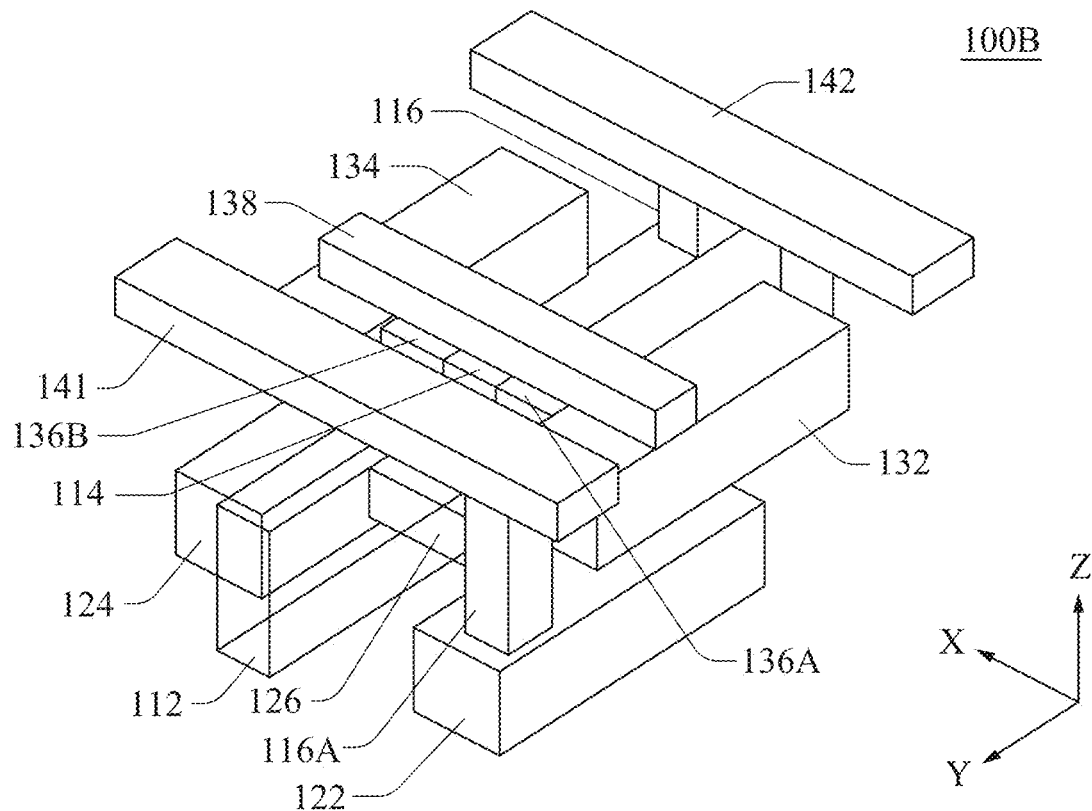
FIG. 6B3

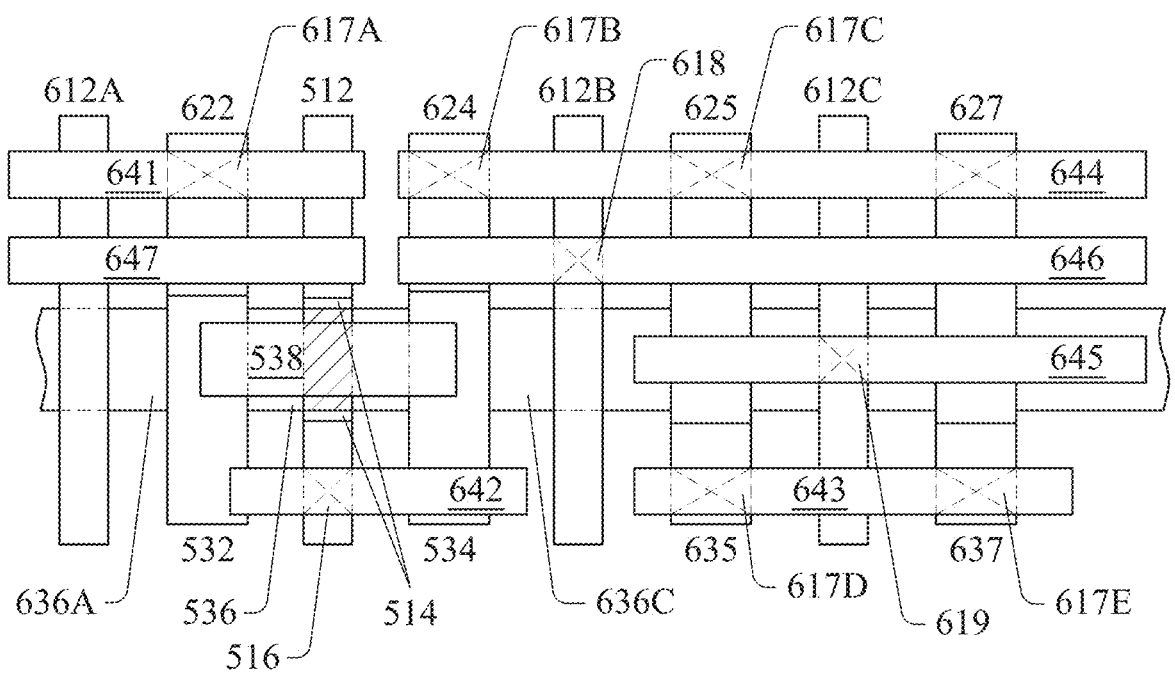
FIG. 6C1
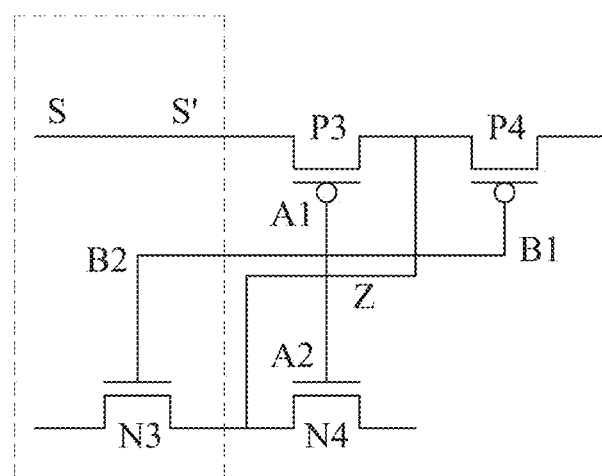
FIG. 6C2

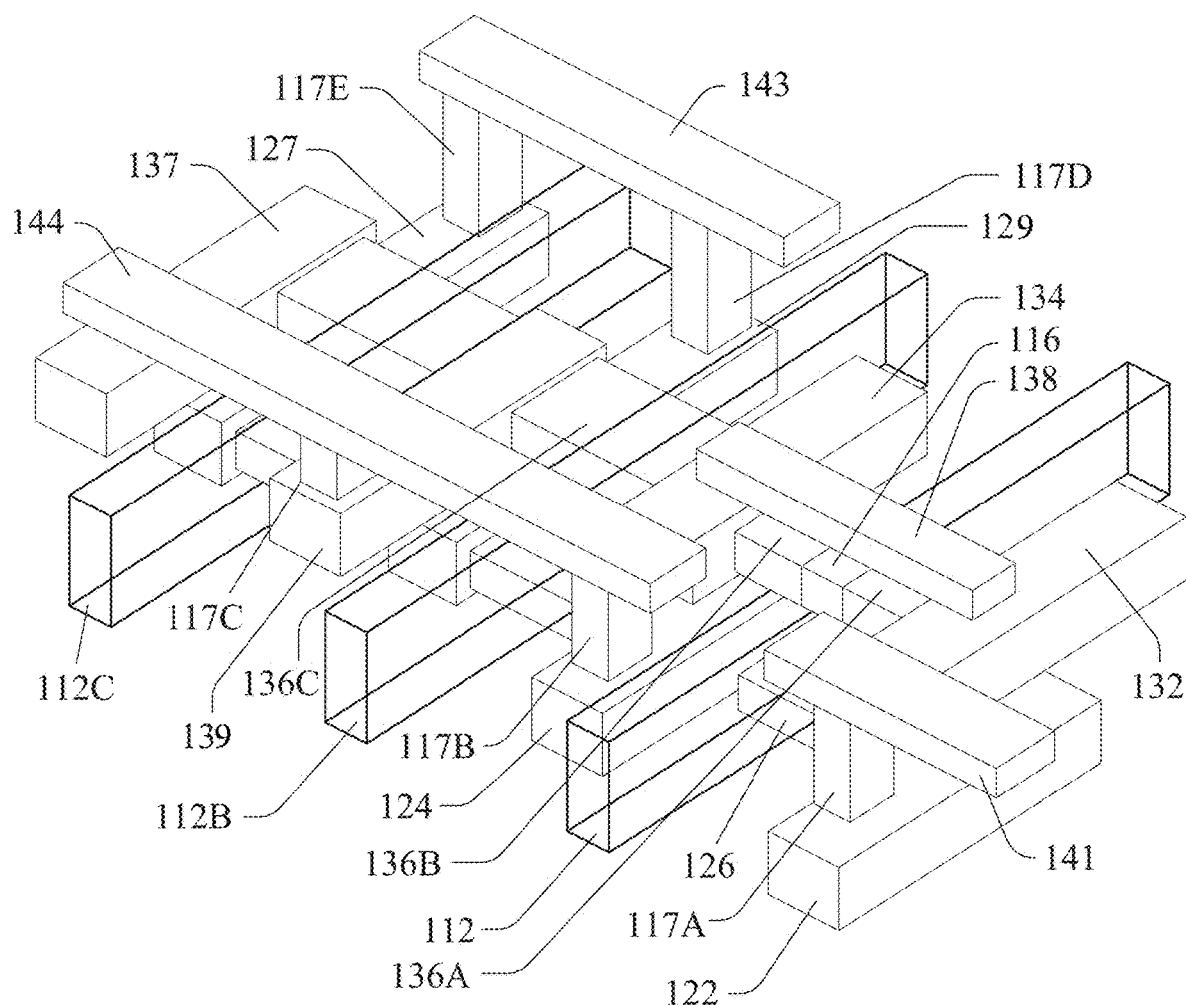
FIG. 6C3

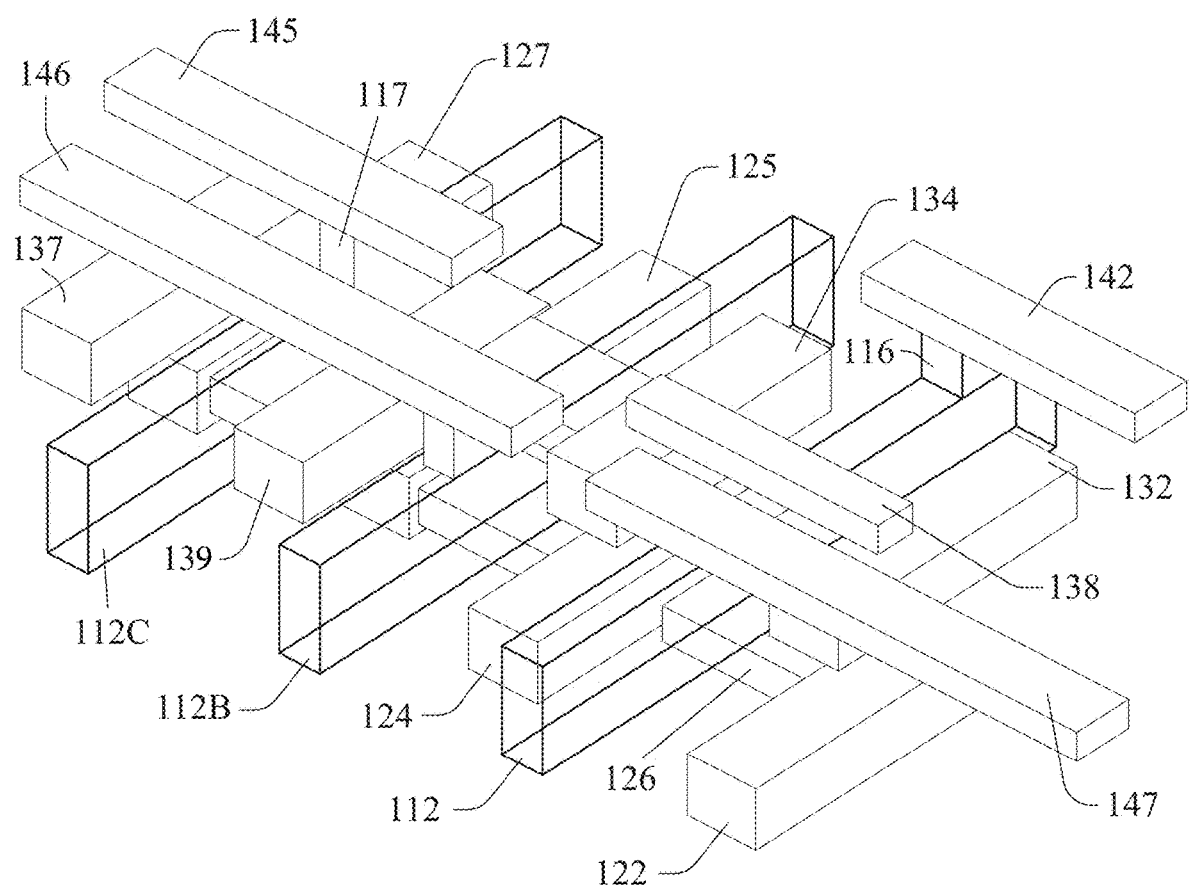
FIG. 6C4

US 12,079,559 B2

IC DEVICE LAYOUT METHOD

PRIORITY CLAIM

The present application is a divisional of U.S. application Ser. No. 17/395,148, filed Aug. 5, 2021, which is a divisional of U.S. application Ser. No. 16/836,631, filed Mar. 31, 2020, now U.S. Pat. No. 11,126,775, issued Sep. 21, 2021, which claims the priority of U.S. Provisional Application No. 62/833,476, filed Apr. 12, 2019, each of which is incorporated herein by reference in its entirety.

BACKGROUND

An integrated circuit (IC) typically includes a number of IC devices that are manufactured in accordance with one or more IC layout diagrams. IC devices sometimes include complementary field effect transistor (CFET) devices in which an upper FET overlies a lower FET in a stack configuration including a shared gate electrode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1D are diagrams of an IC device, in accordance with some embodiments.

FIG. 6A1 depicts an IC layout diagram, in accordance with some embodiments.

FIG. 6A2 is a schematic diagram of an IC device, in accordance with some embodiments.

FIG. 6A3 is a diagram of an IC device, in accordance with some embodiments.

FIG. 6B1 depicts an IC layout diagram, in accordance with some embodiments.

FIG. 6B2 is a schematic diagram of an IC device, in accordance with some embodiments.

FIG. 6B3 is a diagram of an IC device, in accordance with some embodiments.

FIG. 6C1 depicts an IC layout diagram, in accordance with some embodiments.

FIG. 6C2 is a schematic diagram of an IC device, in accordance with some embodiments.

FIGS. 6C3 and 6C4 are diagrams of an IC device, in accordance with some embodiments.

DETAILED DESCRIPTION

Figure 1B:
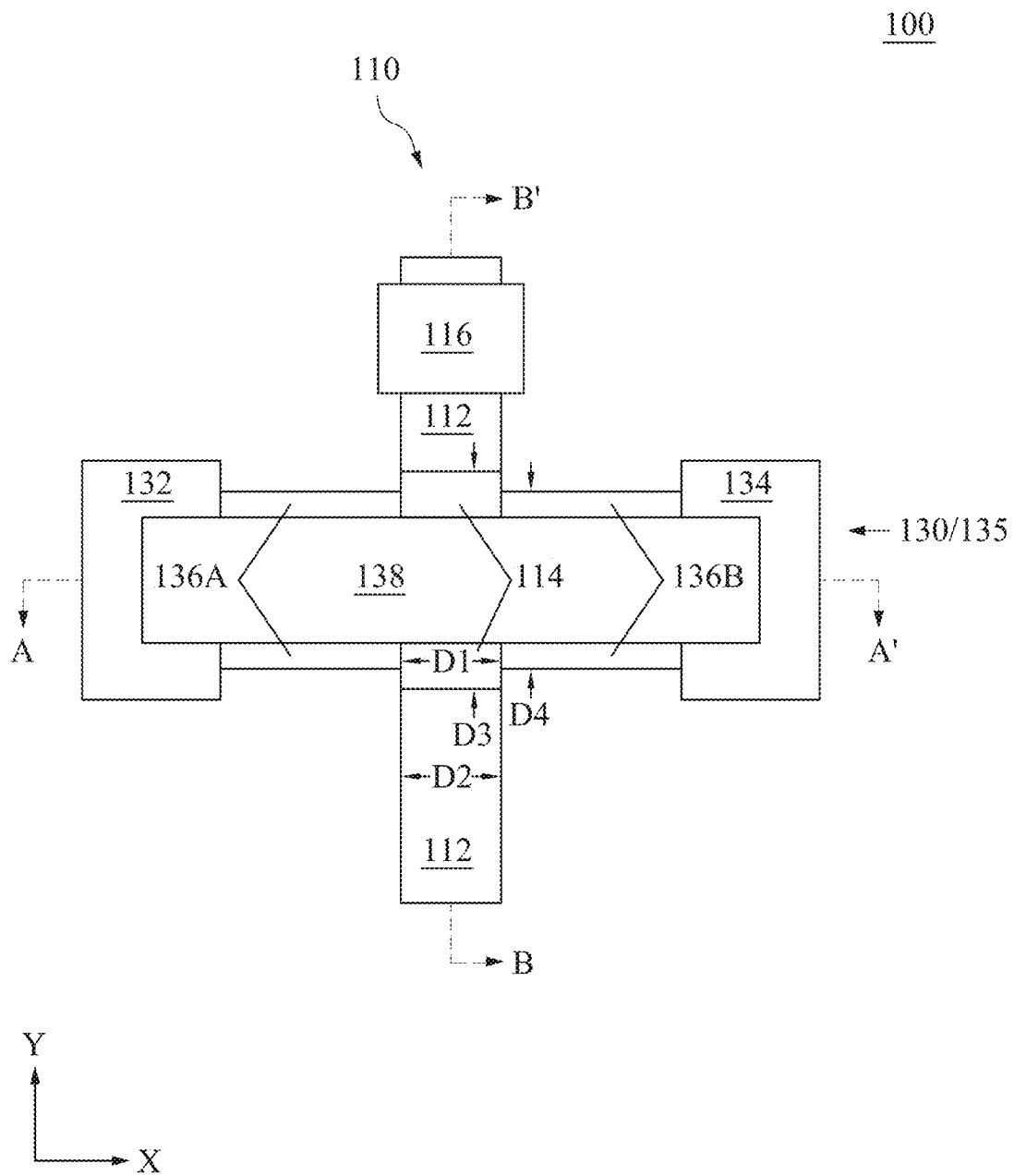

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a gate electrode of a CFET device includes an isolation layer spanned by a conductive structure such that source/drain (S/D) structures of the upper FET structure are electrically connected to each other and isolated from the gate electrode included in the lower FET structure. By including the conductive structure across the isolation layer, the CFET device is capable of providing an electrical connection between circuit elements adjacent to the CFET device without using a segment of an overlying metal layer, e.g., a first metal layer. Circuits and circuit layouts that include such CFET devices thereby require fewer routing resources and have improved routing flexibility compared to approaches in which CFET devices do not include an isolated conductive structure across a gate.

FIGS. 1A-1D are diagrams of an IC device 100 including a conductive structure 138 overlying an isolation layer 114, in accordance with some embodiments. In various embodiments IC device 100, also referred to as a modified CFET device in some embodiments, is formed by executing some or all of the operations of methods 200 and/or 400 and/or is configured based on an IC layout diagram 500, 600A, 600B, or 600C discussed below with respect to FIGS. 4-6C4. In some embodiments, IC device 100 is included in an IC device 860 manufactured by an IC manufacturer/fabricator ("fab") 850, discussed below with respect to FIG. 8.

FIG. 1A depicts a perspective view of IC device 100 including X, Y, and Z directions. FIG. 1B depicts a plan view of IC device 100 including the X and Y directions, an intersection with a plane A-A' along the X direction, and an intersection with a plane B-B' along the Y direction. FIG. 1C depicts a cross-sectional view of IC device 100 along plane A-A' including the X and Z directions, and FIG. 1D depicts a cross-sectional view of IC device 100 along plane B-B' including the Y and Z directions.

IC device 100 includes a gate structure 110 overlying a substrate 100S, a lower structure 120 overlying substrate 100S, and an upper structure 130 overlying lower structure 120. A first element is considered to overlie a second element based on at least a portion of the first element being aligned in the positive Z direction with at least a portion of the second element.

Gate structure 110 includes a gate electrode 112 extending along the Y direction, isolation layer 114 within gate electrode 112, and a gate via 116 overlying gate electrode 112. Lower structure 120 includes S/D structures 122 and 124 and channel 126 aligned in the X direction. Upper structure 130 includes S/D structures 132 and 134 and channel portions 136A and 136B aligned in the X direction, and conductive structure 138 extending along the X direction and overlying S/D structures 132 and 134 and channel portions 136A and 136B.

Channel 126 is electrically connected to each of S/D structures 122 and 124 and extends through gate electrode 112, and gate electrode 112 is electrically connected to gate via 116. Lower structure 120 and gate structure 110 are thereby configured as a FET 125 including S/D terminals corresponding to S/D structures 122 and 124, and a gate terminal corresponding to gate via 116, as further discussed below.

Channel portion 136A is electrically connected to S/D structure 132, channel portion 136B is electrically connected to S/D structure 134; channel portions 136A and 136B are electrically isolated from each other and from gate electrode 112 by isolation layer 114; and conductive structure 138 is electrically connected to each of S/D structures 132 and 134. Upper structure 130 and gate structure 110 are thereby configured as a conductive device 135 electrically isolated from FET 125 and including terminals corresponding to S/D structures 132 and 134, as further discussed below.

The depictions of IC device 100 in FIGS. 1A-1D are simplified for the purpose of clarity. FIGS. 1A-1D depict views of IC device 100 with various features included, excluded, or having simplified shapes, and/or having simplified size, shape, and/or alignment relationships with other features, to facilitate the discussion below. In various embodiments, IC device 100 includes one or more features (not shown), e.g., contacts, dielectric layers, vias, metal segments, or power rails, metal interconnects, transistor elements, wells, isolation structures, or the like, in addition to the elements depicted in FIGS. 1A-1D.

Substrate 100S is a portion of a semiconductor wafer, e.g., a semiconductor wafer 853 discussed below with respect to FIG. 8, suitable for forming one or more IC devices. In various embodiments, substrate 100S includes n-type silicon (Si) including one or more donor dopants, e.g., phosphorous (P) or arsenic (As), or p-type silicon including one or more acceptor dopants, e.g., boron (B) or aluminum (Al).

Each of channel 126 and channel portions 136A and 136B (referred to collectively as channel portions 136A/136B) is one or more semiconductor structures extending along the X direction that include one or more semiconductor materials and are usable as components of FET devices. In various embodiments, one or both of channel 126 or channel portions 136A/136B includes one or more of Si, indium phosphide (InP), germanium (Ge), gallium arsenide (GaAs), silicon germanium (SiGe), indium arsenide (InAs), silicon carbide (SiC), or another suitable semiconductor material.

In various embodiments, one or both of channel 126 or channel portions 136A/136B includes one or more of an epitaxial layer, a nanosheet, or other suitable semiconductor structure. The term "nanosheet" refers to a substantially two-dimensional material that is a single monolayer thick or several monolayers thick, thereby having a thickness ranging from 1 nanometer (nm) to 100 nm in some embodiments, and has lateral dimensions from, for example, hundreds of nanometers to greater than one micron. In some embodiments, a nanosheet or nanosheet stack defines a metal-like defined (MD) segment.

In various embodiments, an MD segment includes a portion of at least one metal layer, e.g., one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more of Si, SiGe, SiC, B, P, As, Ga, a metal as discussed above, or another material suitable for providing the low resistance level. In some embodiments, an MD segment includes a dopant having a doping concentration of about $1*10^{16}$ per cubic centimeter ($cm^{-3}$) or greater.

In some embodiments, one of channel 126 or channel portions 136A/136B includes an n-type semiconductor material including one or more donor dopants and the other of channel 126 or channel portions 136A/136B includes a p-type semiconductor material including one or more acceptor dopants, channel 126 and channel portions 136A/136B thereby including separate types of semiconductor materials. In some embodiments, each of channel 126 and channel portions 136A/136B includes a same n-type or p-type semiconductor material.

S/D structures 122 and 124 are semiconductor structures configured to have a doping type opposite that of channel 126, and S/D structures 132 and 134 are semiconductor structures configured to have a doping type opposite that of channel portions 136A/136B. In some embodiments, one or more of S/D structures 122, 124, 132, or 134 is configured to have lower resistivity than corresponding channel 126 or channel portions 136A/136B. In some embodiments, S/D structures 122, 124, 132, and 134 include one or more portions having doping concentrations greater than one or more doping concentrations present in corresponding channel 126 or channel portions 136A/136B. In various embodiments, one or more of S/D structures 122, 124, 132, or 134 includes epitaxial regions of a semiconductor material, e.g., Si, SiGe, and/or silicon-carbide SiC. In various embodiments, one or more of S/D structures 122, 124, 132, or 134 includes one or more MD segments.

Gate electrode 112 is a volume including one or more conductive materials substantially surrounded by one or more dielectric layers (not shown) including one or more dielectric materials configured to electrically isolate the one or more conductive materials from overlying, underlying, and/or adjacent structures, e.g., channel 126.

Conductive materials include one or more of polysilicon, copper (Cu), aluminum (Al), tungsten (W), cobalt (Co), ruthenium (Ru), or one or more other metals, and/or one or more other suitable materials. Dielectric materials include one or more of silicon dioxide ($SiO_2$), silicon nitride ($Si_3N_4$), and/or a high-k dielectric material, e.g., a dielectric material having a k value higher than 3.8 or 7.0 such as aluminum oxide ($Al_2O_3$), hafnium oxide ($HfO_2$), tantalum pentoxide ($Ta_2O_5$), or titanium oxide ($TiO_2$), or another suitable material.

In the embodiment depicted in FIGS. 1A-1D, gate electrode 112 surrounds channel 126, includes the one or more conductive materials separated from channel 126 by the one or more dielectric layers, and is thereby configured to control an electric field strength applied to channel 126. In various embodiments, gate electrode 112 is otherwise configured, e.g., does not include a portion below channel 126 so as to completely surround channel 126, and is thereby capable of controlling an electric field strength applied to channel 126.

By the configuration discussed above, S/D structures 122 and 124 and channel 126 of lower structure 120, and gate electrode 112 of gate structure 110 are arranged as components of FET 125 in which a voltage on gate electrode 112 is capable of controlling conduction between S/D structures 122 and 124 through channel 126. In some embodiments, the components of FET 125 are arranged as an NMOS transistor. In some embodiments, the components of FET 125 are arranged as a PMOS transistor.

In the embodiment depicted in FIGS. 1A-1D, channel 126 of FET 125 includes a portion between S/D structure 122 and gate electrode 112, a portion within gate electrode 112, and a portion between gate electrode 112 and S/D structure 124. In various embodiments, one or both of S/D structures 122 or 124 is adjacent to gate electrode 112 such that channel 126 of FET 125 does not include a corresponding one or both of the portion between S/D structure 122 and gate electrode 112 or the portion between gate electrode 112 and S/D structure 124.

The arrangement of FET 125 depicted in FIGS. 1A-1D is simplified for the purpose of illustration. In various embodiments, FET 125 includes one or more elements (not shown) in addition to those depicted in FIGS. 1A-1D and/or one or both of S/D structures 122 or 124 extends in the X and/or Y direction so as to facilitate electrical connections.

Gate via 116 is an IC structure including one or more conductive materials configured to electrically connect gate electrode 112 to an overlying metal segment (not shown), and is thereby configured as the gate terminal of FET 125. In the embodiment depicted in FIGS. 1A-1D, IC device 100 includes a single gate via 116 electrically connected to gate electrode 112 and positioned away from conductive structure 138 in the positive Y direction. In various embodiments, IC device 100 includes one or more gate vias (not shown) in addition to gate via 116, electrically connected to gate electrode 112, and positioned away from conductive structure 138 in one or both of the positive or negative Y directions, and the gate vias, including gate via 116, are thereby collectively configured as the gate terminal of FET 125.

Isolation layer 114 is one or more dielectric layers including one or more dielectric materials configured to electrically isolate channel portions 136A and 136B from each other and from gate electrode 112. Accordingly, isolation layer 114 has a dimension D1 in the X direction equal to or greater than a dimension D2 of gate electrode 112 in the X direction, a dimension D3 in the Y direction equal to or greater than a dimension D4 of channel portions 136A and 136B in the Y direction, and a dimension D5 in the Z direction equal to or greater than a dimension D6 of channel portions 136A and 136B in the Z direction.

In the embodiment depicted in FIGS. 1A-1D, isolation layer 114 has dimension D1 equal to dimension D2 of gate electrode 112, dimension D3 greater than dimension D4 of channel portions 136A and 136B, and dimension D5 greater than dimension D6 of channel portions 136A and 136B, and is thereby configured to electrically isolate channel portions 136A and 136B from each other and from gate electrode 112. In various embodiments, isolation layer 114 has one or more of dimensions D1, D2, or D3 otherwise related to respective dimensions D4, D5, or D6 and is thereby configured to electrically isolate channel portions 136A and 136B from each other and from gate electrode 112.

In the embodiment depicted in FIGS. 1A-1D, isolation layer 114 is positioned within gate electrode 112 such that gate electrode 112 is laterally adjacent to isolation layer 114 in both the positive and negative Y directions. In some embodiments, isolation layer 114 extends along an entirety of gate electrode 112 in one of the positive or negative Y directions such that gate electrode 112 is laterally adjacent to isolation layer 114 only in the other of the positive or negative Y directions.

In the embodiment depicted in FIGS. 1A-1D, an upper surface 114S of isolation layer 114 is coplanar with an upper surface 112S of gate electrode 112. In various embodiments, some or all of upper surface 114S is offset from some or all of upper surface 112S in the positive or negative Z direction.

Conductive structure 138 is an IC structure including one or more conductive materials configured to electrically connect S/D structure 132 to S/D structure 134. Accordingly, conductive structure 138 extends along the X direction and overlies at least a portion of each of S/D structures 132 and 134 in the Z direction. In various embodiments, conductive structure 138 directly contacts isolation layer 114 and each of S/D structures 132 and 134, or IC device 100 includes one or more additional layers (not shown) between conductive structure 138 and a corresponding one or more of isolation layer 114 or S/D structures 132 or 134.

In the embodiment depicted in FIGS. 1A-1D, S/D structure 132 extends beyond conductive structure 138 in the negative X direction, and S/D structure 134 extends beyond conductive structure 138 in the positive X direction. In various embodiments, conductive structure 138 is coextensive with or extends beyond S/D structure 132 in the negative X direction and/or conductive structure 138 is coextensive with or extends beyond S/D structure 134 in the positive X direction.

In the embodiment depicted in FIGS. 1A-1D, S/D structure 132 extends beyond conductive structure 138 in each of the positive and negative Y directions, and S/D structure 134 extends beyond conductive structure 138 in each of the positive and negative Y directions. In various embodiments, conductive structure 138 is coextensive with or extends beyond S/D structure 132 in one or both of the positive or negative Y directions, and/or conductive structure 138 is coextensive with or extends beyond S/D structure 134 in one or both of the positive or negative Y directions.

In the embodiment depicted in FIGS. 1A-1D, conductive structure 138 has a dimension (not labeled) in the Y direction smaller than dimension D4 of channel portions 136A/136B and is centered within dimension D4 in the Y direction. In some embodiments, conductive structure 138 has the dimension in the Y direction equal to or larger than dimension D4. In some embodiments, conductive structure 138 is offset from the center of dimension D4 in the Y direction. In some embodiments, conductive structure 138 is positioned partially or entirely outside of dimension D4 in the Y direction.

In the embodiment depicted in FIGS. 1A-1D, conductive structure 138 has a dimension D7 in the Z direction equal to a dimension D8 of gate via 116 in the Z direction. In various embodiments, conductive structure 138 has dimension D7 greater or less than dimension D8.

By the configuration discussed above, S/D structures 132 and 134, channel portions 136A/136B, and conductive structure 138 of upper structure 130, and isolation layer 114 of gate structure 110 are arranged as components of conductive device 135 in which an electrical connection between S/D structures 132 and 134 is provided by overlying conductive structure 138. In the embodiment depicted in FIGS. 1A-1D, conductive device 135 includes channel portion 136A between S/D structure 132 and isolation layer 114 and channel portion 136B between isolation layer 114 and S/D structure 134. In various embodiments, one or both of S/D structures 132 or 134 is laterally adjacent to isolation layer 114 such that conductive device 135 does not include a corresponding one or both of channel portion 136A between S/D structure 132 and isolation layer 114 or channel portion 136B between isolation layer 114 and S/D structure 134.

The arrangement of conductive device 135 depicted in FIGS. 1A-1D is simplified for the purpose of illustration. In various embodiments, conductive device 135 includes one or more elements (not shown) in addition to those depicted in FIGS. 1A-1D and/or one or both of S/D structures 132 or 134 extends in the X and/or Y direction so as to facilitate electrical connections. In some embodiments, conductive device 135 includes one or more dielectric layers (not shown) overlying one or more of source drain structures 132 or 134, channel portions 136A or 136B, or conductive structure 138, conductive device 135 thereby being configured to be electrically isolated from one or more elements (not shown) above, below, and/or adjacent to conductive device 135.

As discussed above, IC device 100 including isolation layer 114 and conductive structure 138 is configured to provide an electrical connection through S/D structures 132 and 134 of conductive device 135 that is isolated from FET 125. By applying this electrical connection to circuit elements adjacent to IC device 100, circuit connections are able to be made without using a segment of an overlying metal layer, e.g., a first metal layer. Circuits and circuit layouts that include IC device 100 thereby require fewer routing resources and have improved routing flexibility compared to approaches in which CFET devices do not include an isolated conductive structure across a gate.

Figure 2:
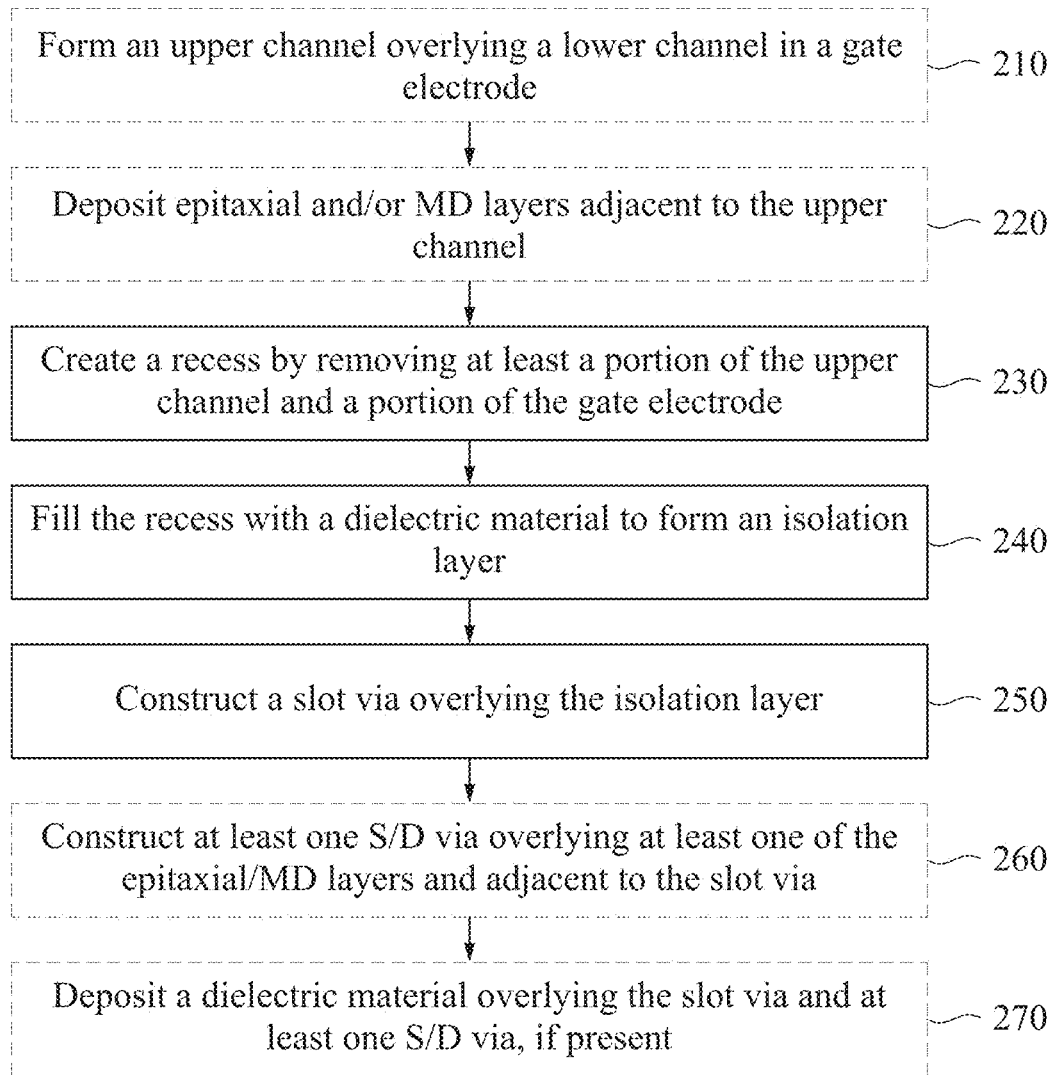
FIG. 2 is a flowchart of a method of manufacturing an IC device, in accordance with some embodiments.

FIG. 2 is a flowchart of a method 200 of forming a modified CFET device, e.g., IC device 100 discussed above with respect to FIGS. 1A-1D, in accordance with some embodiments. FIGS. 3A-3G are diagrams of an IC device 300 including IC device 100 and an adjacent CFET 300C at various manufacturing stages corresponding to the operations of method 200, in accordance with some embodiments. Each of FIGS. 3A-3G includes first and second diagrams from left to right that correspond to the plan and cross-sectional views of IC device 100 depicted in respective FIGS. 1B and 1C. To facilitate the illustration of the various features, the plan views depicted in FIGS. 3A-3G omit portions or all of various device elements, e.g., dielectric layers, spacers, or the like.

The sequence in which the operations of method 200 are depicted in FIG. 2 is for illustration only; the operations of method 200 are capable of being executed simultaneously or in sequences that differ from that depicted in FIG. 2. In some embodiments, operations in addition to those depicted in FIG. 2 are performed before, between, during, and/or after the operations depicted in FIG. 2.

At operation 210, in some embodiments, an upper channel is formed overlying a lower channel in a gate electrode. In some embodiments, forming the upper channel overlying the lower channel in the gate electrode corresponds to forming a channel 136 corresponding to channel portions 136A/136B overlying channel 126 in a gate electrode including gate electrode 112 discussed above with respect to FIGS. 1A-1D, and depicted in FIG. 3A.

In some embodiments, forming one or both of the upper or lower channels in the gate electrode includes forming one or more epitaxial and/or nanosheet layers of a semiconductor material. In some embodiments, forming one or both of the upper or lower channels in the gate electrode includes depositing one or more of Si, InP, Ge, GaAs, SiGe, InAs, SiC, or another suitable semiconductor material.

In various embodiments, a deposition process includes a chemical vapor deposition (CVD), a plasma enhanced CVD (PECVD), an atomic layer deposition (ALD), or other process suitable for depositing one or more material layers.

In various embodiments, forming the upper or lower channel in the gate electrode includes forming a portion or all of the gate electrode. In some embodiments, forming the upper or lower channel in the gate structure includes forming multiple layers of the upper or lower channel and at least a portion of the gate electrode between the multiple layers.

In various embodiments, forming the portion or all of the gate electrode includes depositing one or more conductive materials, e.g., polysilicon, Cu, Al, W, Co, Ru, and/or one or more dielectric materials, e.g., $SiO_2$, $Si_3N_4$, $Al_2O_3$, $HfO_2$, $Ta_2O_5$, or $TiO_2$.

In some embodiments, the gate electrode is one gate electrode of a plurality of gate electrodes, and forming the upper channel overlying the lower channel is part of forming one upper channel of a corresponding plurality of upper channels overlying one lower channel of a corresponding plurality of lower channels. In the embodiment depicted in FIG. 3A, forming upper channel 136 of IC device 100 is part of an operation in which an upper channel 336 is formed overlying a lower channel 326 in a gate electrode 312 of CFET 300C.

At operation 220, in some embodiments, epitaxial and/or MD layers are deposited adjacent to the upper channel. Depositing the epitaxial and/or MD layers adjacent to the upper channel includes or is part of forming S/D structures adjacent to the upper channel. In some embodiments, depositing the epitaxial and/or MD layers adjacent to the upper channel corresponds to forming S/D structures 132 and 134 adjacent to channel 136 discussed above with respect to FIGS. 1A-1D, and depicted in FIG. 3B.

Figure 3A:
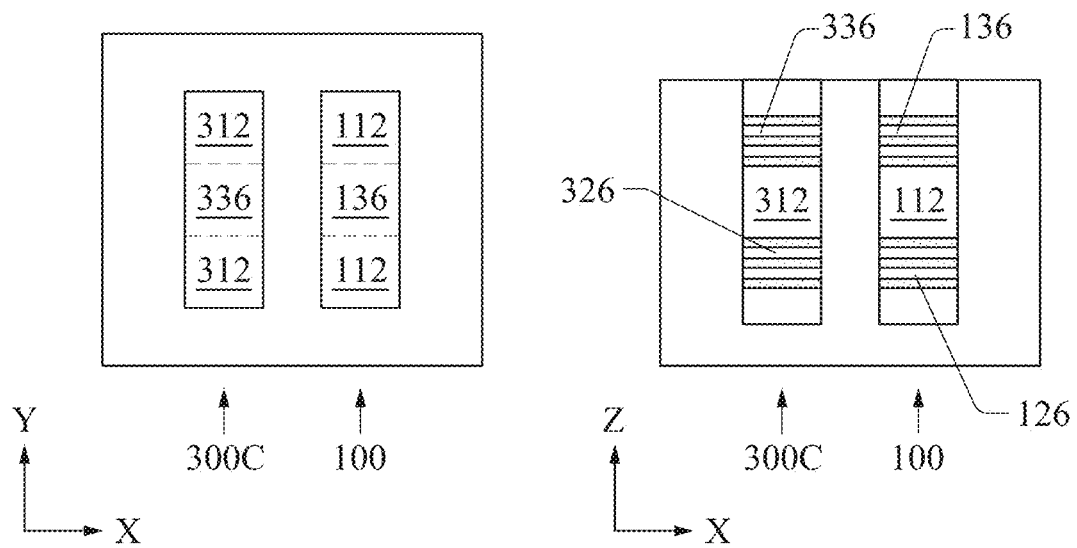
FIGS. 3A-3G are diagrams of an IC device at various manufacturing stages, in accordance with some embodiments.
Figure 3B:
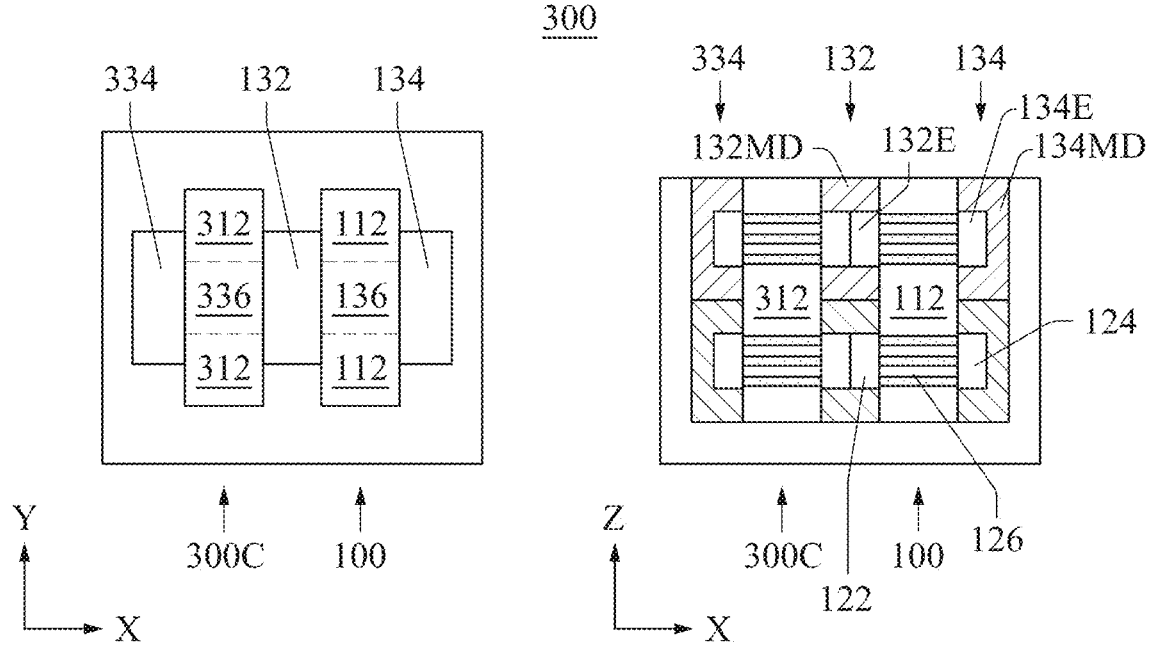
Figure 3C:
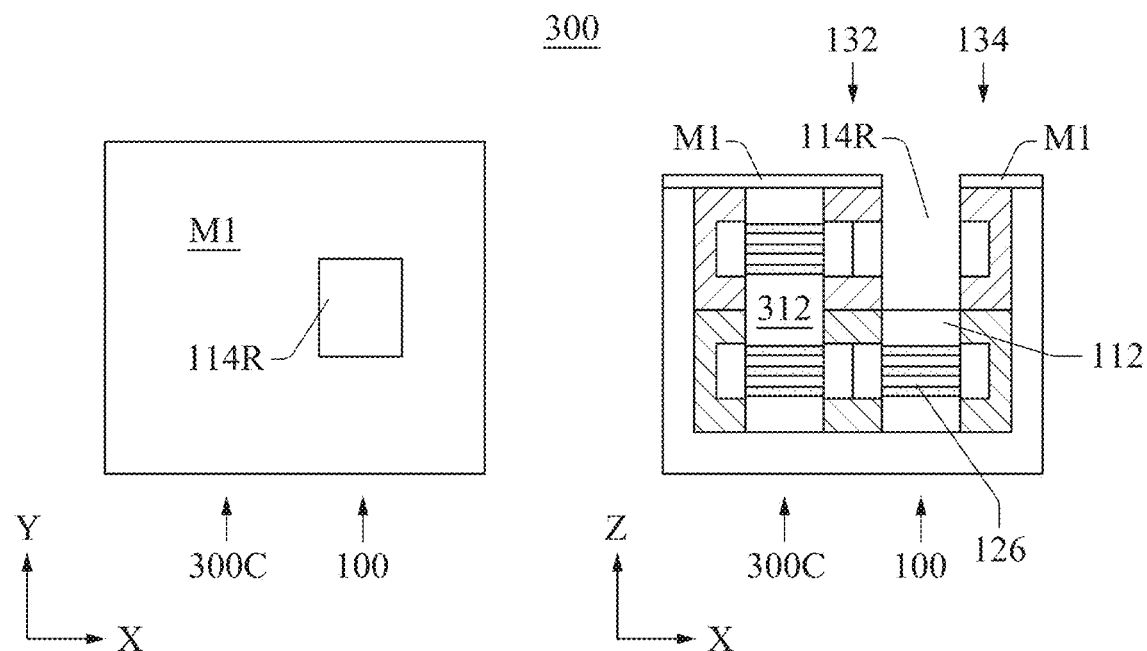
Figure 3D:
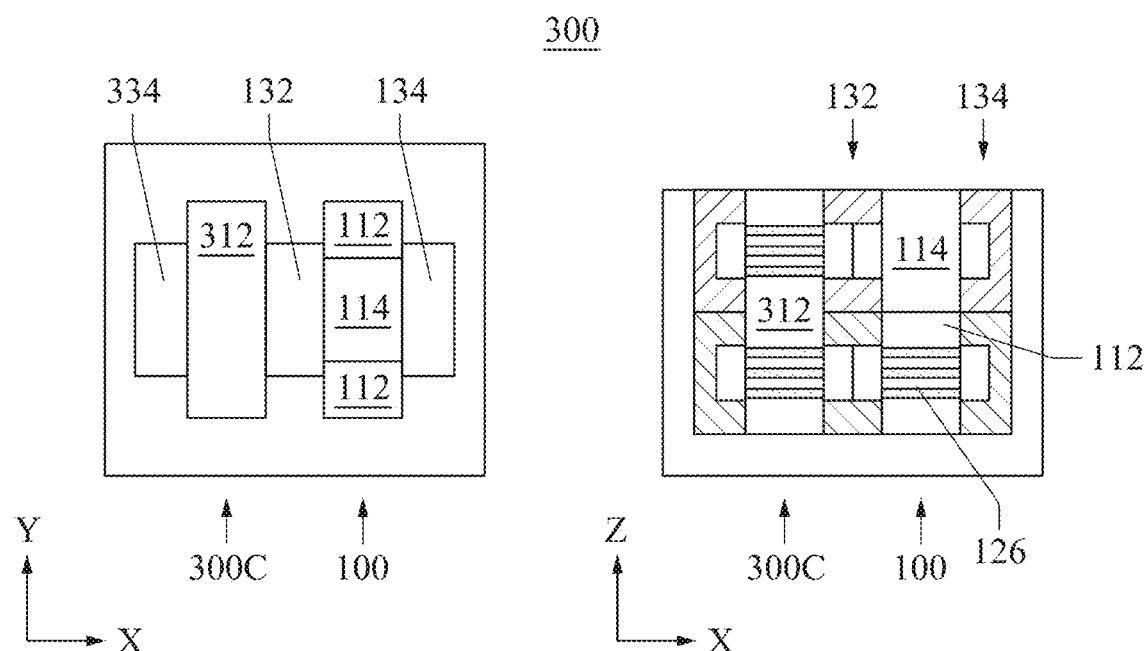
Figure 3E:
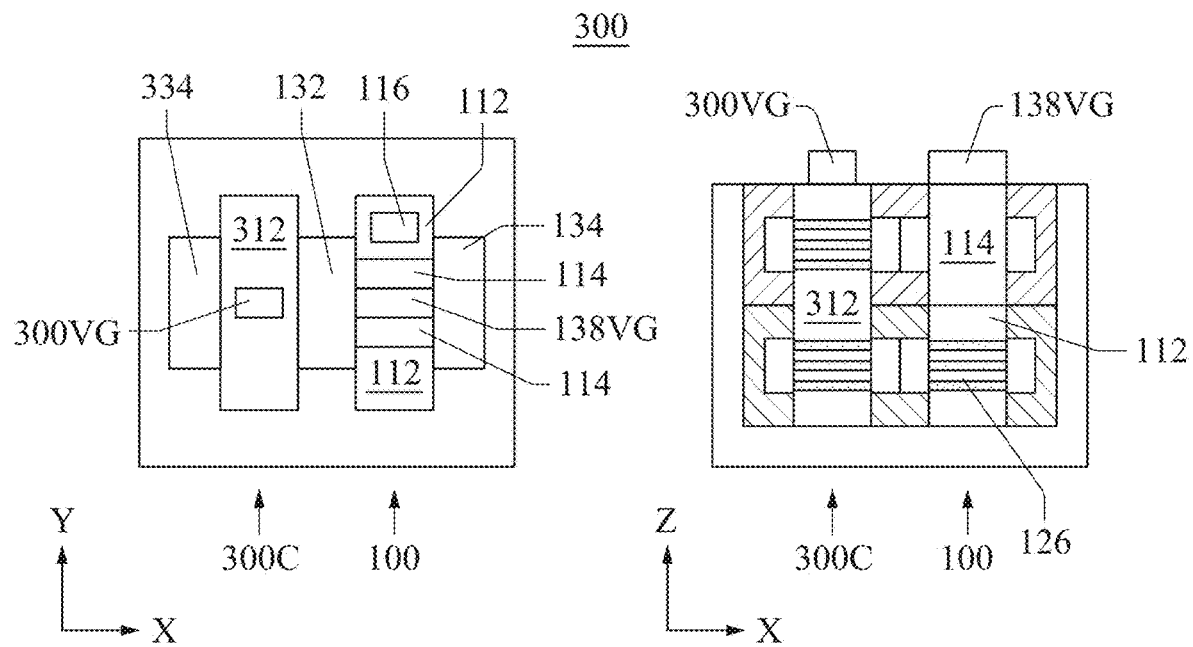
Figure 3F:
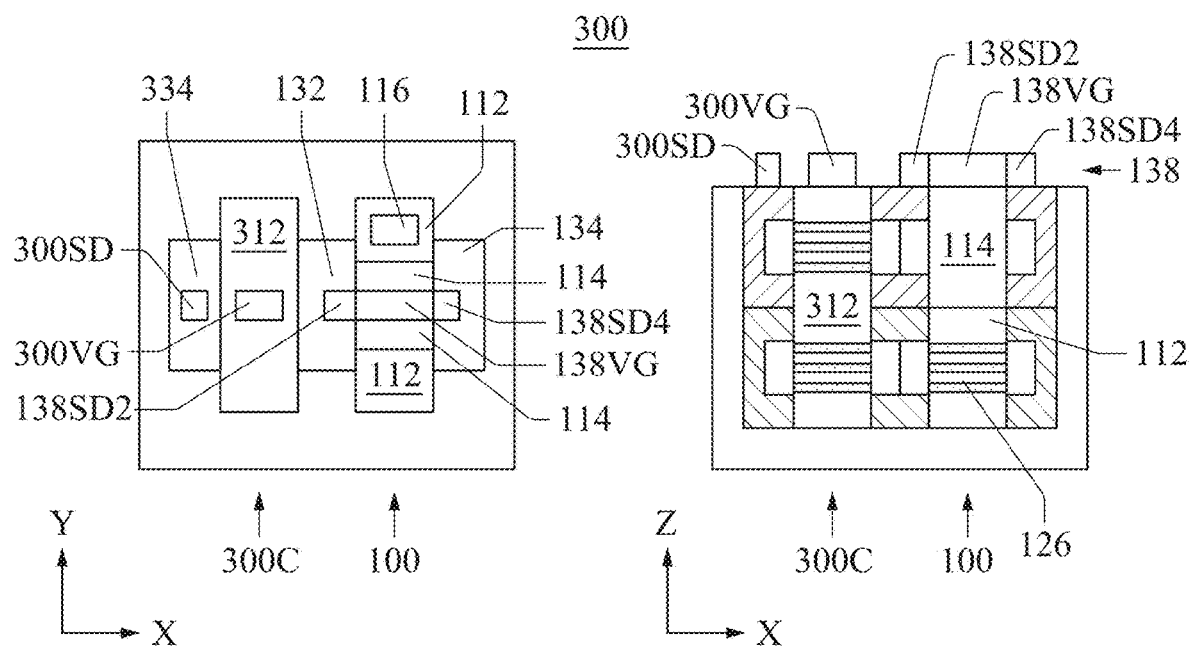

In some embodiments, depositing the epitaxial and/or MD layers includes depositing at least one epitaxial layer adjacent to the upper channel followed by depositing at least one MD layer adjacent to the at least one epitaxial layer. In some embodiments, depositing the epitaxial and/or MD layers includes depositing epitaxial layer 132E followed by depositing MD layer 132MD, thereby forming S/D structure 132, and depositing epitaxial layer 134E followed by depositing MD layer 134MD, thereby forming S/D structure 134, as depicted in FIG. 3B.

In some embodiments, depositing the epitaxial and/or MD layers adjacent to the upper channel includes depositing epitaxial and/or MD layers adjacent to the lower channel. In some embodiments, depositing the epitaxial and/or MD layers adjacent to the lower channel corresponds to forming S/D structures 122 and 124 adjacent to channel 126 discussed above with respect to FIGS. 1A-1D, and depicted in FIG. 3B.

In some embodiments, depositing the epitaxial and/or MD layers adjacent to the upper channel includes depositing one or more of Cu, Ag, W, Ti, Ni, Sn, Al. In various embodiments, depositing epitaxial and/or MD layers adjacent to the upper channel includes performing a doping operation, e.g., an implant process. In various embodiments, performing the doping operation includes using one or more of Si, SiGe, SiC, B, P, As, Ga, a metal, or another material suitable for providing a low resistance level. In some embodiments, performing the doping operation includes doping to a doping concentration of about $1*10^{16}$ per cubic centimeter ($cm^{-3}$) or greater.

In some embodiments, the upper channel is one upper channel of a plurality of upper channels, and depositing epitaxial and/or MD layers adjacent to the upper channel is part of depositing epitaxial and/or MD layers adjacent to each upper channel of the plurality of upper channels. In the embodiment depicted in FIG. 3B, depositing epitaxial and/or MD layers adjacent to upper channel 136 is part of an operation in which epitaxial and/or MD layers are deposited adjacent to the upper channel of CFET 300C, thereby forming S/D structure 132 shared with IC device 100 and an additional S/D structure 334 of CFET 300C.

At operation 230, a recess is created by removing at least a portion of the upper channel and a portion of the gate electrode. Removing the at least portion of the upper channel and the portion of the gate electrode includes creating the recess having a positioning and sufficiently large dimensions in each direction to electrically isolate the S/D structures from each other, as discussed below.

In the X direction, the position and dimension of the recess, e.g., dimension D1 discussed above with respect to FIG. 1B, are configured such that the recess extends at least across the corresponding dimension of the gate electrode, e.g., dimension D2 discussed above with respect to FIG. 1B.

In the Y direction, the position and dimension of the recess, e.g., dimension D3 discussed above with respect to FIG. 1B, are configured such that the recess extends at least across the corresponding dimension of the upper channel, e.g., dimension D4 discussed above with respect to FIG. 1B, or, in some embodiments, across the corresponding dimension of one or both of the S/D structures. In some embodiments, the position and dimension of the recess in the Y direction are configured such that the recess extends beyond the corresponding dimension of one or both of the S/D structures in one or both of the positive or negative Y directions.

In the Z direction, the position and dimension of the recess, e.g., dimension D5 discussed above with respect to FIG. 1C, are configured such that the recess extends at least across the corresponding dimension of the upper channel, e.g., dimension D6 discussed above with respect to FIG. 1C, or, in some embodiments, across the corresponding dimension of one or both of the S/D structures.

In various embodiments, electrically isolating the S/D structures from each other includes separating the upper channel into two electrically isolated portions adjacent to the recess, reducing the upper channel to a single portion adjacent to the recess, or removing an entirety of the upper channel. Reducing the upper channel to the single portion corresponds to creating the recess adjacent to one of the S/D structures, and removing the entirety of the upper channel corresponds to creating the recess adjacent to each of the S/D structures.

In some embodiments, separating the upper channel into two electrically isolated portions includes separating the upper channel, e.g., channel 136, into channel portions 136A and 136B discussed above with respect to FIGS. 1A-1D. In the embodiment depicted in FIG. 3C, creating the recess includes creating recess 114R adjacent to each of S/D structures 132 and 134 by removing an entirety of channel 136.

In some embodiments, creating the recess includes removing the at least portion of the upper channel and the portion of the gate electrode without removing a portion or all of the lower channel.

In some embodiments, creating the recess includes applying a mask and removing the at least portion of the upper channel and the portion of the gate electrode exposed by the mask. In some embodiments, creating the recess includes applying mask M1 depicted in FIG. 3C.

In some embodiments, removing the at least portion of the upper channel and the portion of the gate electrode includes performing one or more etching operations. In various embodiments, performing an etching operation includes using one or more etch processes such as a wet etch, a dry etch, a sputtering etch or other suitable removal process. In various embodiments, using an etching process includes using one or more etchant materials, e.g., one or more of $Cl_2$, $SF_6$, HBr, HCl, $CF_4$, $CHF_3$, $C_2F_6$, $C_4F_8$, or another suitable etchant material.

In some embodiments, creating the recess includes removing the mask, e.g., mask M1.

At operation 240, the recess is filled with a dielectric material to form an isolation layer. Filling the recess with the dielectric material includes forming the dielectric layer having dimensions corresponding to the dimensions of the recess discussed above. In some embodiments, filling the recess with the dielectric material to form the isolation layer includes forming isolation layer 114 discussed above with respect to FIGS. 1A-1D, and depicted in FIG. 3D. In some embodiments, filling the recess with the dielectric material to form the isolation layer includes filling recess 114R depicted in FIG. 3C.

In some embodiments, filling the recess includes using a deposition process. In some embodiments, filling the recess includes filling all of the recess up to an upper surface of the gate electrode, e.g., upper surface 112S discussed above with respect to FIGS. 1A-1D, or all of the recess plus a volume (not shown) above the upper surface adjacent to the recess.

In some embodiments, filling the recess includes performing a planarization process. In various embodiments, a planarization process includes a chemical-mechanical polishing (CMP) or other process suitable for producing a planarized top surface at a given manufacturing stage. In some embodiments, performing the planarization process includes causing upper surface 114S of isolation layer 114 to become coplanar with upper surface 112S of gate electrode 112, discussed above with respect to FIGS. 1A-1D.

At operation 250, a slot via is constructed overlying the isolation layer. Constructing the slot via includes depositing one or more conductive materials in accordance with one or more masks. In various embodiments, constructing the slot via includes depositing the one or more conductive materials directly on the isolation layer or on a layer (not shown) overlying the isolation layer. In some embodiments, constructing the slot via includes constructing a portion or all of conductive structure 138 having dimension D7 in the Z direction and overlying isolation layer 114, discussed above with respect to FIGS. 1A-1D.

Constructing the slot via includes positioning and constructing the slot via to have a dimension in the X direction (not labeled) extending at least across the corresponding dimension of the isolation layer, e.g., dimension D1 discussed above with respect to FIG. 1B. In some embodiments, constructing the slot via includes constructing the slot via extending between positions corresponding to edges of the isolation layer along the X direction, e.g., constructing a slot via 138VG extending to edges of isolation layer 114 depicted in FIG. 3E.

In some embodiments, constructing the slot via includes constructing the slot via extending beyond the edges of the isolation layer in one or both of the positive or negative X directions, the slot via thereby overlying at least a portion of one or both of the S/D structures. In various embodiments, constructing the slot via includes depositing the one or more conductive materials directly on the at least portion of one or both of the S/D structures.

In some embodiments, the slot via is a gate via of a plurality of gate vias, and constructing the slot via is part of constructing the plurality of gate vias. In some embodiments, constructing the plurality of gate vias includes constructing gate vias, e.g., a gate via 300VG depicted in FIG. 3E, having the dimension in the X direction (not labeled) smaller than the dimension of the slot via in the X direction. In some embodiments, constructing the plurality of gate vias includes constructing gate via 116 discussed above with respect to FIGS. 1A-1D and depicted in FIGS. 3E-3G.

At operation 260, in some embodiments, at least one S/D via is constructed overlying at least one of the epitaxial and/or MD layers and adjacent to the slot via. Constructing the at least one S/D via includes depositing one or more conductive materials in accordance with one or more masks. In some embodiments, constructing the at least one S/D via includes constructing a portion or portions of conductive structure 138 overlying the corresponding at least one of S/D structures 132 or 134, discussed above with respect to FIGS. 1A-1D.

Constructing the at least one S/D via adjacent to the slot via includes constructing the at least one S/D via electrically connected to the slot via. In some embodiments, constructing the at least one S/D via adjacent to the slot via includes constructing an S/D via 138D2 overlying S/D structure 132 and adjacent to slot via 138VG, and constructing an S/D via 138D4 overlying S/D structure 134 and adjacent to slot via 138VG, thereby forming conductive structure 138 discussed above with respect to FIGS. 1A-1D and depicted in FIG. 3F.

In some embodiments, the at least one S/D via is at least one S/D via of a plurality of S/D vias, and constructing the at least one S/D via is part of constructing the plurality of S/D vias. In some embodiments, constructing the plurality of S/D vias includes constructing an S/D via 300SD depicted in FIG. 3F.

At operation 270, in some embodiments, a dielectric material is deposited overlying the slot via and at least one S/D via, if present. Depositing the dielectric material overlying the slot and at least one S/D via, if present, includes forming an insulation layer on an entirety of an upper surface of the slot via and at least one S/D via, thereby electrically isolating the slot via and at least one S/D via from an overlying conductive structure, e.g., a conductive segment of a first metal layer.

Figure 3G:
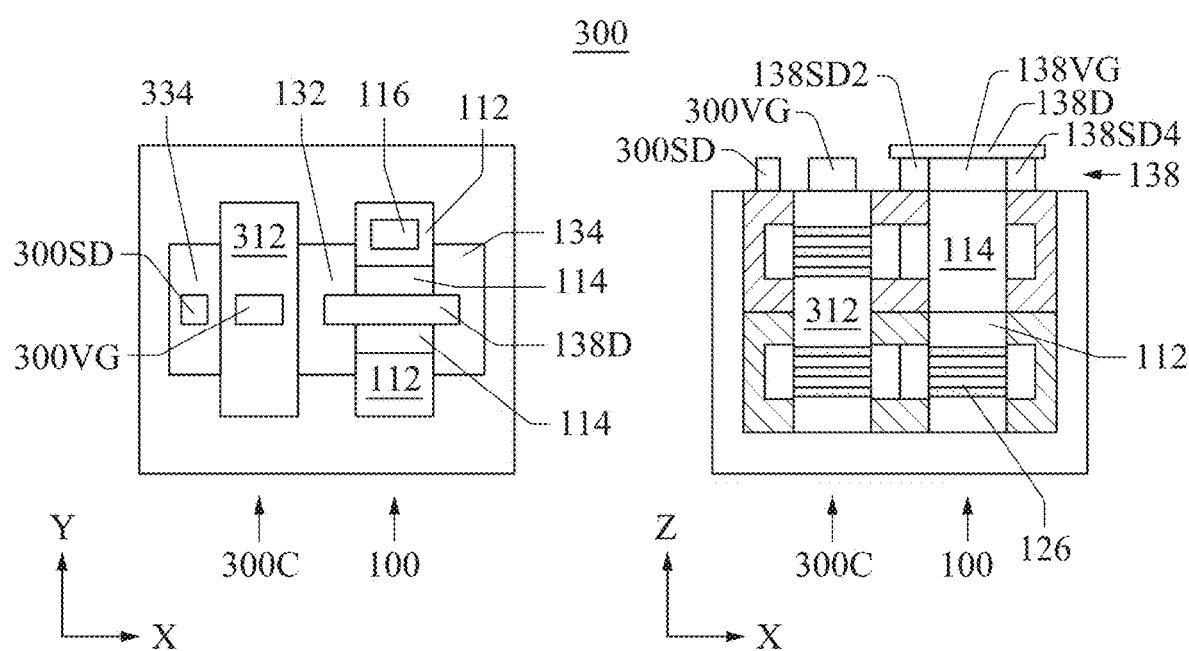

In some embodiments, depositing the dielectric material overlying the slot and at least one S/D via includes forming an insulation layer 138D on an entirety of upper surfaces (not labeled) of slot via 138VG and S/D vias 138SD2 and 138SD4 depicted in FIG. 3G.

In some embodiments, depositing the dielectric material overlying the slot and at least one S/D via is part of an operation in which an insulation layer (not shown) is formed including openings above one or more additional vias, e.g., one or both of gate via 300VG or S/D via 300SD, thereby enabling electrical connections from the one or more additional vias to one or more overlying conductive structures, e.g., one or more conductive segments of a first metal layer.

The operations of method 200 are usable to form a modified CFET device including an isolation layer spanned by a conductive structure, e.g., IC device 100 including isolation layer 114 and conductive structure 138 discussed above with respect to FIGS. 1A-1D, the modified CFET device thereby being configured to provide an electrical connection through S/D structures that is isolated from a lower FET, e.g., FET 125. By applying this electrical connection to circuit elements adjacent to the modified CFET device, e.g., using S/D structure 134 as an S/D terminal of the upper transistor of adjacent CFET 300C, circuit connections are able to be made without using a segment of an overlying metal layer. Compared to methods that do not include forming the isolation layer and conductive structure, method 200 is usable to form IC devices with improved routing flexibility as discussed above with respect to IC device 100.

Figure 4:
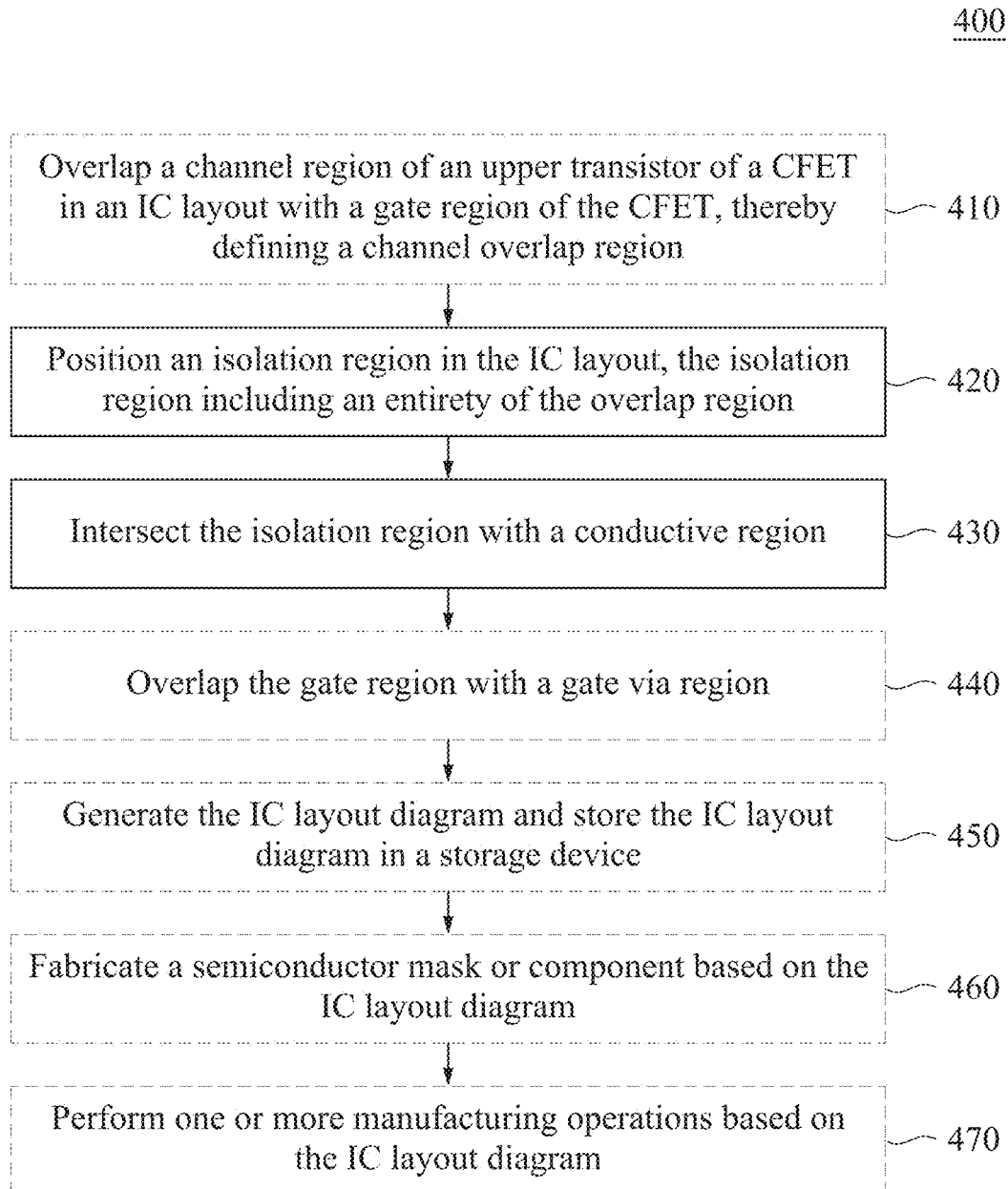
FIG. 4 is a flowchart of a method of generating an IC layout diagram, in accordance with some embodiments.

FIG. 4 is a flowchart of a method 400 of generating an IC layout diagram, in accordance with some embodiments. In some embodiments, generating the IC layout diagram includes generating one or more of IC layout diagram 500, 600A, 600B, or 600C discussed below, corresponding to an IC device including an isolation layer and conductive structure, e.g., IC device 100 including isolation layer 114 and conductive structure 138 discussed above with respect to FIGS. 1A-3G and below with respect to FIGS. 6A3, 6B3, 6C3, and 6C4, manufactured based on the generated IC layout diagram. Non-limiting examples of IC devices include memory circuits, logic devices, processing devices, signal processing circuits, and the like.

In some embodiments, some or all of method 400 is executed by a processor of a computer. In some embodiments, some or all of method 400 is executed by a processor 702 of EDA system 700, discussed below with respect to FIG. 7.

In some embodiments, one or more operations of method 400 are a subset of operations of a method of forming an IC device. In some embodiments, one or more operations of method 400 are a subset of operations of an IC manufacturing flow, e.g., an IC manufacturing flow discussed below with respect to a manufacturing system 800 and FIG. 8.

In some embodiments, the operations of method 400 are performed in the order depicted in FIG. 4. In some embodiments, the operations of method 400 are performed simultaneously and/or in an order other than the order depicted in FIG. 4. In some embodiments, one or more operations are performed before, between, during, and/or after performing one or more operations of method 400.

FIGS. 5, 6A1, 6B1, and 6C1 are depictions of non-limiting examples of corresponding IC layout diagrams 500, 600A, 600B, and 600C generated by executing one or more operations of method 400, in some embodiments. In addition to IC layout diagram 500, 600A, 600B, or 600C, each of FIGS. 5, 6A1, 6B1, and 6C1 includes the X and Y directions, discussed above with respect to FIGS. 1A-3G.

FIG. 6A2 is a schematic diagram 600AS corresponding to IC layout diagram 600A and to an IC device 100A depicted in FIG. 6A3 along with the X, Y, and Z directions discussed above with respect to FIGS. 1A-3G. FIG. 6B2 is a schematic diagram 600BS corresponding to IC layout diagram 600B and to an IC device 100B depicted in FIG. 6B3 along with the X, Y, and Z directions. FIG. 6C2 is a schematic diagram 600CS corresponding to IC layout diagram 600C and to an IC device 100C depicted in FIGS. 6C3 and 6C4 along with the X, Y, and Z directions. Schematic diagrams 600As, 600BS, and 600CS, and IC devices 100A, 100B, and 100C are further discussed below.

Each of IC layout diagrams 500, 600A, 600B, and 600C includes layout features corresponding to a modified CFET device that includes an isolation layer and conductive structure, e.g., isolation layer 114 and conductive structure 138, discussed above with respect to FIGS. 1A-3G. IC layout diagram 500 corresponds to a modified CFET device, IC layout diagram 600A corresponds to a modified CFET device configured as a bridge between adjacent transistors, IC layout diagram 600B corresponds to a modified CFET device configured as a transistor and bridge, and IC layout diagram 600C corresponds to a modified CFET device configured as a transistor and bridge of a transmission gate.

IC layout diagrams 500, 600A, 600B, and 600C are simplified for the purpose of clarity. In various embodiments, one or more of IC layout diagrams 500, 600A, 600B, or 600C includes features in addition to those depicted in FIGS. 5, 6A1, 6B1, and 6C1, e.g., one or more transistor elements, power rails, isolation structures, wells, conductive elements, or the like. In various embodiments, each of IC layout diagrams 500, 600A, 600B, and 600C depicts features corresponding to one or more upper FETs or FET-based devices of a CFET device, and includes features corresponding to one or more lower FETs of the CFET device that are not necessarily depicted, or only partially depicted, for the purpose of clarity.

Figure 5:
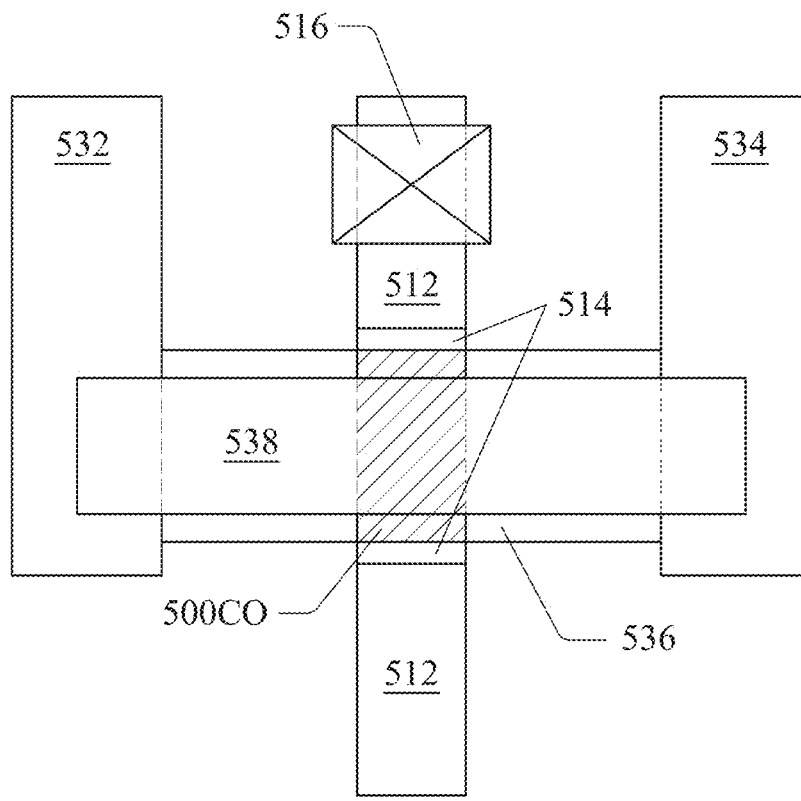
FIG. 5 depicts an IC layout diagram, in accordance with some embodiments.

As depicted in FIG. 5, IC layout diagram 500 includes a gate region 512 extending in the Y direction, an isolation region 514 within gate region 512, a via region 516, S/D regions 532 and 534, a channel region 536 extending in the X direction, and a conductive region 538 extending in the X direction. A channel overlap region 500CO corresponds to an overlap of gate region 512 with channel region 536.

As depicted in FIG. 6A1, IC layout diagram 600A includes gate region 512, isolation region 514, S/D regions 532 and 534, channel region 536, conductive region 538, and channel overlap region 500CO (shaded), and does not include via region 516. IC layout diagram 600A also includes gate regions 612A and 612B in parallel with gate region 512, via regions 616A and 616B, S/D regions 622 and 624, channel regions 636A and 636C aligned with channel region 536 in the X direction, and a conductive region 641 extending in the X direction.

As depicted in FIG. 6B1, IC layout diagram 600B includes gate regions 512, 612A, and 612B, isolation region 514, via regions 516 and 616A, S/D regions 532, 534, 622, and 624, channel regions 536, 636A, and 636C, conductive regions 538 and 641, channel overlap region 500CO (shaded), and a conductive region 642 extending in the X direction.

As depicted in FIG. 6C1, IC layout diagram 600C includes gate regions 512, 612A, 612B, and 612C, isolation region 514, via regions 516, 616A, 617A-617E, 618, and 619, S/D regions 532, 534, 622, 624, 625, 627, 635, and 637, channel regions 536, 636A, and 636C, conductive regions 538, 641, and 642 channel overlap region 500CO (shaded), and conductive regions 643-647 extending in the X direction.

A gate region, e.g., one of gate regions 512, 612A, 612B, or 612C, is a region in the IC layout diagram included in the manufacturing process as part of defining a gate structure in the IC device including at least one of a conductive material or a dielectric material. In various embodiments, one or more gate structures corresponding to a gate region includes at least one conductive material overlying and/or surrounding at least one dielectric material. In various embodiments, gate region 512 is included in a manufacturing process as part of defining corresponding gate structure 110 discussed above with respect to FIGS. 1A-3G.

An isolation region, e.g., isolation region 514, is a region in the IC layout diagram included in the manufacturing process as part of defining one or more dielectric material layers in the IC device. In various embodiments, isolation region 514 is included in a manufacturing process as part of defining isolation layer 114 discussed above with respect to FIGS. 1A-3G.

A via region, e.g., one of via regions 516, 616A, 616B, 617A-617E, 618, or 619, is a region in the IC layout diagram included in the manufacturing process as part of defining a via including one or more segments of one or more conductive layers in the IC device configured to form an electrical connection between one or more underlying contacts, conductive segments, or gate structures and one or more overlying conductive segments. In various embodiments, via region 516 is included in a manufacturing process as part of defining via 116 discussed above with respect to FIGS. 1A-3G.

An S/D region, e.g., one of S/D regions 532, 534, 622, 624, 625, 627, 635, or 637, is a region in the IC layout diagram included in a manufacturing process as part of defining an S/D structure, also referred to as an epitaxial and/or MD layer in some embodiments, on a semiconductor substrate. In various embodiments, one or more of S/D regions 532, 534, 622, or 624 are included in a manufacturing process as part of defining one or more of S/D structures 122, 124, 132, or 134 discussed above with respect to FIGS. 1A-3G.

A channel region, e.g., one of channel regions 536, 636A, or 636C, is a region in the IC layout diagram included in the manufacturing process as part of defining one or more channels of a CFET device. In various embodiments, channel region 536 is included in a manufacturing process as part of defining channel 136 and channel portions 136A and 136B discussed above with respect to FIGS. 1A-3G.

A conductive region, e.g., one of conductive regions 538 or 641-647, is a region in the IC layout diagram included in the manufacturing process as part of defining one or more conductive, e.g., metal, segments of a conductive layer in the IC device. In various embodiments, a conductive region corresponds to one or more of an MD layer, a via layer, a first metal layer (also referred to as a metal zero layer in some embodiments), or a second or higher metal layer in the IC device. In various embodiments, conductive region 538 is included in a manufacturing process as part of defining conductive structure 138 discussed above with respect to FIGS. 1A-3G. In some embodiments, one or more of conductive regions 641-647 is included in a manufacturing process as part of defining a first metal segment.

In the embodiments depicted in FIGS. 5, 6A1, 6B1, and 6C1, each of IC layout diagrams 500, 600A, 600B, and 600C includes conductive region 538 overlapping each of isolation region 514 and S/D regions 532 and 534, and is thereby configured to define a conductive structure spanning an isolation layer positioned within a gate electrode. Conductive region 538, isolation region 514, and S/D regions 532 and 534 thereby correspond to a conductive device, e.g., conductive device 135 discussed above with respect to FIGS. 1A-3G, in which S/D structures are electrically connected to each other and electrically isolated from a lower FET of a modified CFET device. Thus, each of IC layout diagrams 500, 600A, 600B, and 600C is usable to form IC devices having the benefits, e.g., improved routing flexibility, discussed above with respect to IC device 100.

In various embodiments, one or more of IC layout diagrams 500, 600A, 600B, or 600C is included in one or more IC layout diagrams corresponding to one or more IC devices, e.g., a logic device, transmission gate, latch circuit, or the like, in which electrical connections to CFETs and one or more modified CFETs are routed through conductive segments in a first metal layer, and, based on the improved routing flexibility, the conductive segments correspond to a spacing of a total of four or fewer first metal layer tracks between adjacent power rails (not shown in FIGS. 5, 6A1, 6B1, and 6C1).

Each of IC layout diagrams 500, 600B, and 600C also includes via region 516 overlapping gate region 512, and is thereby configured to define a via electrically connected to the gate electrode defined by gate region 512. Via region 516 and gate region 512 thereby correspond to a gate terminal of the lower FET of the modified CFET device.

IC layout diagram 500 also includes channel region 536 intersected by isolation region 514, and is thereby configured to define channel portions 136A and 136B discussed above with respect to FIGS. 1A-3G.

IC layout diagram 600A also includes S/D regions 622 and 624 of the lower FET and conductive region 641 corresponding to a first metal segment of the first metal layer. S/D region 622 overlaps via region 616A and conductive region 641, and S/D region 624 overlaps via region 616B and conductive region 641; IC layout diagram 600A is thereby configured to define a conductive structure including terminals corresponding to S/D structures defined by S/D regions 622 and 624 electrically connected to each other through the first metal segment defined by conductive region 641.

IC layout diagram 600A also includes channel region 636A intersecting gate region 612A and adjacent to S/D regions 532 and 622, and is thereby configured to define a first CFET adjacent to the modified CFET device defined by IC layout diagram 500, and includes channel region 636C intersecting gate region 612B and adjacent to S/D regions 534 and 624, and is thereby configured to define a second CFET adjacent to the modified CFET device.

As discussed above, IC layout diagram 600A is thereby configured to define an IC device including the first and second CFETs bridged by the modified CFET device, in which the upper FETs of the first and second CFETs are bridged by the conductive structure defined by conductive region 538, isolation layer 514, and S/D regions 532 and 534, and the lower FETs of the first and second CFETs are bridged by the conductive structure defined by conductive region 641, via regions 616A and 616B, and S/D regions 622 and 624. IC layout diagram 600A is thereby configured to define the modified CFET device electrically connecting each of the upper and lower FETs of the first CFET to each of the upper and lower FETs of the second CFET by including a single metal segment of the first metal layer. Compared to layouts that use more than a single segment of a first metal layer to electrically connect upper and lower FETs of first and second CFETs, IC layout diagram 600A is usable to form IC devices with improved routing flexibility as discussed above.

In the non-limiting example represented by schematic 600AS, IC layout diagram 600A is used to define IC device 100A in which upper PMOS features are bridged by conductive structure 138, and a lower NMOS is bridged by a conductive segment 141 based on conductive region 641.

As depicted in schematic 600AS of FIG. 6A2, a PMOS transistor P1 corresponds to gate region 612A and S/D region 532 used to define S/D structure 132, and a PMOS transistor P2 corresponds to gate region 612B and S/D region 534 used to define S/D structure 134. PMOS transistors P1 and P2 are bridged by conductive structure 138 based on conductive region 538 and electrically isolated from gate electrode 112 based on gate region 512.

An NMOS transistor N1 corresponds to gate region 612A and S/D region 622 used to define S/D structure 122, and an NMOS transistor N2 corresponds to gate region 612B and S/D region 624 used to define S/D structure 124. NMOS transistors N1 and N2 are bridged by conductive segment 141 based on conductive region 641 and vias 116A and 116B based on respective via regions 616A and 616B.

As depicted in FIG. 6A3, IC device 100A includes S/D structure 132 electrically connected to S/D structure 134 through conductive structure 138, and S/D structure 122 electrically connected to S/D structure 124 through via 116A, conductive structure 141, and via 116B.

Compared to IC layout diagram 600A, IC layout diagram 600B does not include via region 616B, and also includes via region 516 and conductive region 642 corresponding to a second metal segment of the first metal layer. Via region 516 overlaps gate region 512 and conductive region 642, and IC layout diagram 600B is thereby configured to define a lower FET including a first terminal corresponding to the S/D structure defined by S/D region 622 electrically connected to the first metal segment defined by conductive region 641, a second terminal corresponding to the S/D structure defined by S/D region 624, and a gate terminal corresponding to the gate structure defined by gate region 512 electrically connected to the second metal segment defined by conductive region 642.

By also including channel region 636A intersecting gate region 612A and adjacent to S/D regions 532 and 622, IC layout diagram 600B is configured to define first and second CFETs adjacent to the modified CFET device defined by IC layout diagram 500, as discussed above with respect to FIG. 6A.

As discussed above, IC layout diagram 600B is thereby configured to define an IC device including the first and second CFETs bridged by the modified CFET device, in which the upper FETs of the first and second CFETs are bridged by the conductive structure defined by conductive region 538, isolation layer 514, and S/D regions 532 and 534, and the lower FETs of the first and second CFETs are coupled through the conductive structure defined by conductive regions 641 and 642, via regions 516 and 616A, and S/D regions 622 and 624. IC layout diagram 600B is thereby configured to define the modified CFET device including electrical connections to the lower FET through two metal segments of the first metal layer, and electrically connecting the upper FET of the first CFET to the upper FET of the second CFET without using an additional single metal segment of the first metal layer. Compared to layouts that use an additional metal segment of a first metal layer to electrically connect upper FETs of first and second CFETs, IC layout diagram 600B is usable to form IC devices with improved routing flexibility as discussed above.

In the non-limiting example represented by schematic 600B S, IC layout diagram 600B is used to define IC device 100B in which upper PMOS features are bridged by conductive structure 138, and a lower NMOS is electrically connected through conductive segment 141 based on conductive region 641 and a conductive segment 142 based on conductive region 642.

As depicted in schematic 600BS of FIG. 6B2 and as discussed above with respect to FIGS. 6A2 and 6A3, PMOS transistors P1 and P2 are bridged by conductive structure 138 based on conductive region 538 and electrically isolated from gate electrode 112 based on gate region 512.

As further depicted in schematic 600BS, S/D structure 122 based on S/D region 622, S/D structure 124 based on S/D region 624, and gate electrode 112 based on gate region 512 are configured as an NMOS transistor N3. S/D structure 122 is electrically accessible through via 116A based on via region 616A and conductive segment 141 based on conductive region 641, and gate electrode 112 based on gate region 512 is electrically accessible through gate via 116 based on via region 516 and a conductive segment 142 based on conductive region 642. Because NMOS transistors N1 and N3 share S/D structure 122, and NMOS transistors N2 and N3 share S/D structure 124, NMOS transistor N1 is selectively coupled to NMOS transistor N2 through NMOS transistor N3.

As depicted in FIG. 6B3, IC device 100B includes S/D structure 132 electrically connected to S/D structure 134 through conductive structure 138, S/D structure 122 electrically connected to conductive segment 141 through via 117A, and gate electrode 112 electrically connected to conductive structure 142 through gate via 116. FIG. 6B3 further depicts isolation layer 114 and channel portions 136A and 136B, each discussed above with respect to FIGS. 1A-3G.

As depicted in FIG. 6C1, IC layout diagram 600C includes, in addition to the features of IC layout diagram 600B discussed above with respect to FIGS. 6B1-6B3, gate region 612C, S/D regions 625, 627, 635, and 637, via regions 617A-617E, 618, and 619, and conductive regions 643-647. Because IC layout diagram 600C includes the features of IC layout diagram 600B arranged as discussed above with respect to FIG. 6B1, IC layout diagram 600C is usable to form IC devices with improved routing flexibility compared to layouts that use an additional metal segment of a first metal layer to electrically connect upper FETs of first and second CFETs, as discussed above with respect to IC layout diagram 600B.

The additional features of IC layout diagram 600C correspond to a transmission gate, e.g., a transmission gate represented by schematic 600CS of FIG. 6C2 and corresponding to IC device 100C depicted in FIGS. 6C3 and 6C4. FIGS. 6C3 and 6C4 depict overlapping subsets of the additional features for the purpose of illustration.

The transmission gate represented by schematic 600CS includes PMOS transistors P3 and P4, NMOS transistor N3, discussed above with respect to FIGS. 6B1-6B3, and an NMOS transistor N4. A gate A1 of PMOS transistor P3 is electrically connected to a gate A2 of NMOS transistor N4, a gate B1 of PMOS transistor P4 is electrically connected to a gate B2 of NMOS transistor N3, a S/D terminal shared by PMOS transistors P3 and P4 is electrically connected to a S/D terminal shared by NMOS transistors N3 and N4 through a conductive path Z, and a S/D terminal S' of PMOS transistor P3 is electrically connected to a S/D terminal S.

The dashed box in schematic 600CS corresponds to gate region 512, S/D regions 532, 534, 622, and 624, channel region 536, via regions 516 and 617A, and conductive regions 538, 641, and 642 of IC layout diagram 600C, used to define respective gate electrode 112, S/D structures 132, 134, 122, and 124, channel portions 136A and 136B, gate via 116, via 117A, and conductive structures 138, 141, and 142 of IC device 100C depicted in FIGS. 6C3 and 6C4.

Accordingly, as depicted in FIGS. 6C1-6C4, gate B2 corresponds to gate electrode 112 based on gate region 512, S/D terminal S corresponds to S/D structure 132 based on S/D region 532, and S/D terminal S' corresponds to S/D structure 134 based on S/D region 534. S/D terminal S is electrically connected to S/D terminal S' through conductive structure 138 based on conductive region 538.

PMOS transistor P3 corresponds to a gate electrode 112B based on gate region 612B, S/D structure 134 based on S/D region 534, and an S/D structure 139 based on S/D region 635 and shared with PMOS transistor P4. PMOS transistor P4 also corresponds to a gate electrode 112C based on gate region 612C and a S/D structure 137 based on S/D region 637.

NMOS transistor N4 corresponds to gate electrode 112B based on gate region 612B, S/D structure 124 based on S/D region 624 and shared with transistor N3, and a S/D structure 129 based on S/D region 625.

As depicted in FIG. 6C4, gate A1 of PMOS transistor P3 is electrically connected to gate A2 of NMOS transistor N4 through shared gate electrode 112B based on gate region 612B. Gate B2 of NMOS transistor N3 is electrically connected to gate B1 of PMOS transistor P4 through via 117A based on via region 617A, conductive structure 142 based on conductive region 642, a via 117 based on via region 617, a conductive structure 145 based on conductive region 645, and one or more additional conductive structures (not shown).

As depicted in FIG. 6C3, S/D structure 139 shared by PMOS transistors P3 and P4 is electrically connected to S/D structure 124 shared by NMOS transistors N3 and N4 through a via 117C based on via region 617C, a conductive structure 144 based on conductive region 644, and a via 117B based on via region 617B, thereby corresponding to conductive path Z.

As depicted in FIGS. 6C3 and 6C4, IC device 100C also includes an S/D structure 127 based on S/D region 637 electrically connected to S/D structure 129 through a via 117E based on via region 617E, a conductive structure 143 based on conductive region 643, and a via 117D based on via region 617D.

At operation 410, in some embodiments, a channel region of an upper transistor of a CFET in an IC layout is overlapped with a gate region of the CFET, thereby defining a channel overlap region. The channel region is usable in a manufacturing process as part of defining one or more channel structures and the gate region is usable in the manufacturing process as part of defining a corresponding gate electrode, e.g., channel 136 including channel portions 136A/136B corresponding to gate electrode 112 discussed above with respect to FIGS. 1A-3G.

Overlapping the channel region with the gate region of the CFET includes overlapping the channel region extending in a first direction with the gate region extending in a second direction perpendicular to the first direction. Overlapping the channel region with the gate region of the CFET includes defining the channel overlap region including a portion or all of the channel region and a portion of the gate region. In some embodiments, overlapping the channel region with the gate region includes overlapping channel region 536 extending in the X direction with gate region 512 extending in the Y direction, thereby defining channel overlap region 500CO discussed above with respect to FIGS. 5-6C4.

In some embodiments, defining the channel overlap region includes defining the channel overlap region between first and second S/D regions. The first and second S/D regions are usable in the manufacturing process as part of defining first and second S/D structures corresponding to the one or more channel structures, e.g., S/D structures 132 and 134 discussed above with respect to FIGS. 1A-3G. In some embodiments, defining the channel overlap region between first and second S/D regions includes defining the channel overlap region between S/D regions 532 and 534 discussed above with respect to FIGS. 5-6C4.

At operation 420, an isolation region is positioned in the IC layout, the isolation region including an entirety of the overlap region. The isolation region is usable in the manufacturing process as part of defining an isolation layer, e.g., isolation layer 114 discussed above with respect to FIGS. 1A-3G.

In various embodiments, positioning the isolation region includes the isolation region having a width equal to or greater than a width of the overlap region in the first direction and/or the isolation region having a length equal to or greater than a length of the overlap region in the second direction. In some embodiments, positioning the isolation region includes positioning isolation region 514 discussed above with respect to FIGS. 5-6C4.

At operation 430, the isolation region is intersected with a conductive region. The conductive region is usable in the manufacturing process as part of defining one or more conductive structures, e.g., conductive structure 138 discussed above with respect to FIGS. 1A-3G.

Intersecting the isolation region with the conductive region includes the conductive region extending across at least an entirety of the isolation region in the first direction. In some embodiments, the conductive region is one conductive region of a plurality of conductive regions, e.g., a plurality of via regions, and intersecting the isolation region with the conductive region includes intersecting the isolation region with the plurality of conductive regions extending across at least the entirety of the isolation region in the first direction.

In some embodiments, intersecting the isolation region with the conductive region includes overlapping the isolation region with a gate via region of the conductive region, and overlapping each of the S/D regions with the conductive region includes overlapping each of the S/D regions with an S/D via region adjacent to the gate via region. The gate and S/D via regions are usable in the manufacturing process as part of defining one or more conductive structures, e.g., slot via 138VG and S/D vias 138SD2 and 138SD4 discussed above with respect to FIGS. 2-3G.

In some embodiments, intersecting the isolation region with the conductive region includes intersecting isolation region 514 with conductive region 538 discussed above with respect to FIGS. 5-6C4.

In some embodiments, intersecting the isolation region with the conductive region includes overlapping each of the S/D regions with the conductive region, e.g., intersecting S/D regions 532 and 534 discussed above with respect to FIGS. 5-6C4.

In some embodiments, intersecting the isolation region with the conductive region includes the conductive region being separated from the channel region. In some embodiments, intersecting the isolation region with the conductive region includes overlapping the channel region with the conductive region. In some embodiments, intersecting the isolation region with the conductive region includes overlapping channel region 536 with conductive region 538 discussed above with respect to FIGS. 5-6C4.

At operation 440, in some embodiments, the gate region is overlapped with a gate via region. The gate via region is usable in the manufacturing process as part of defining one or more conductive structures, e.g., gate via 116 discussed above with respect to FIGS. 1A-3G. In some embodiments, overlapping the gate region with the gate via region includes overlapping gate region 512 with gate via region 516 discussed above with respect to FIGS. 5-6C4.

Overlapping the gate region with the gate via region includes the gate via region being offset from the channel overlap region. In some embodiments, the gate via region is one gate via region of a plurality of gate via regions, and overlapping the gate region with the gate via region includes overlapping the gate via region with the plurality of gate via regions, each gate via region being offset from the channel overlap region. In some embodiments, overlapping the gate region with the gate via region includes gate via region 516 being offset from channel overlap region 500CO discussed above with respect to FIGS. 5-6C4.

At operation 450, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 460, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 470, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 400, an IC layout diagram, e.g., IC layout diagram 500, 600A, 600B, or 600C, is generated including a CFET including an isolation region intersecting a conductive region, thereby being configured to form an isolation layer spanned by a conductive structure in a modified CFET device manufactured based on the IC layout diagram. Compared to methods that do not include configuring an isolation region and conductive region to form the isolation layer and conductive structure, method 400 is usable to generate IC layout diagrams and devices having improved routing flexibility as discussed above with respect to IC device 100, thereby supporting IC layouts and devices in which a separation between adjacent power rails corresponds to a total of four or fewer metal regions corresponding to signal traces.

Figure 7:
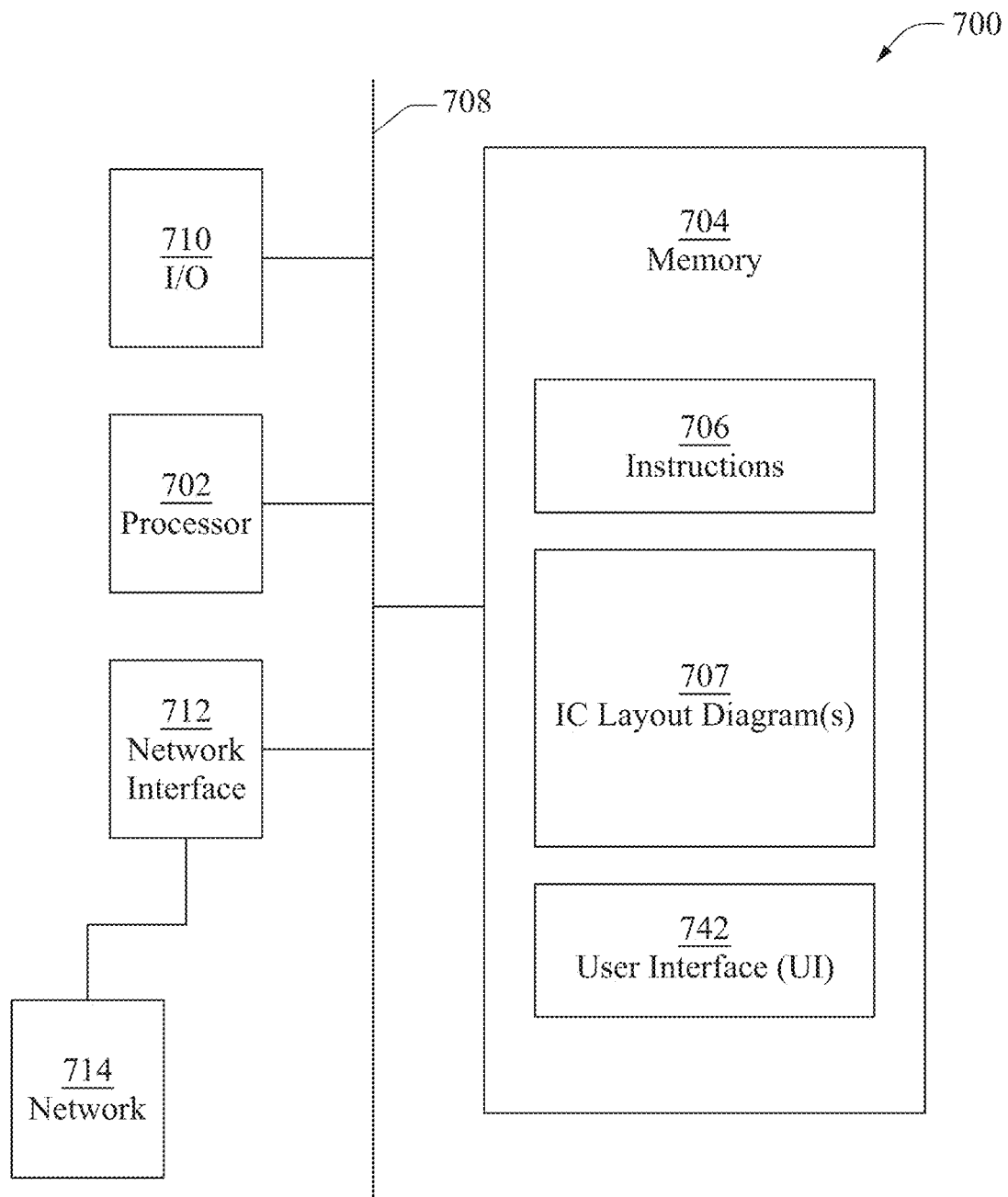
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an APR system. Methods described herein of designing layout diagrams representing wire routing arrangements, in accordance with one or more embodiments, are implementable, for example, using EDA system 700, in accordance with some embodiments.

In some embodiments, EDA system 700 is a general purpose computing device including a processor 702 and a non-transitory, computer-readable storage medium 704, also referred to as a memory 704 in some embodiments. Computer-readable storage medium 704, amongst other things, is encoded with, i.e., stores, computer program code 706, i.e., a set of executable instructions also referred to as instructions 706 in some embodiments. Execution of computer program code 706 by processor 702 represents (at least in part) an EDA tool which implements a portion or all of a method according to an embodiment, e.g., method 400 described above with respect to FIG. 4 (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause system 700 (where such execution represents (at least in part) the EDA tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores IC layout diagram(s) 707 including IC layout diagrams as disclosed herein, e.g., IC layout diagrams 500, 600A, 600B, and/or 600C discussed above with respect to FIGS. 5-6C4.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
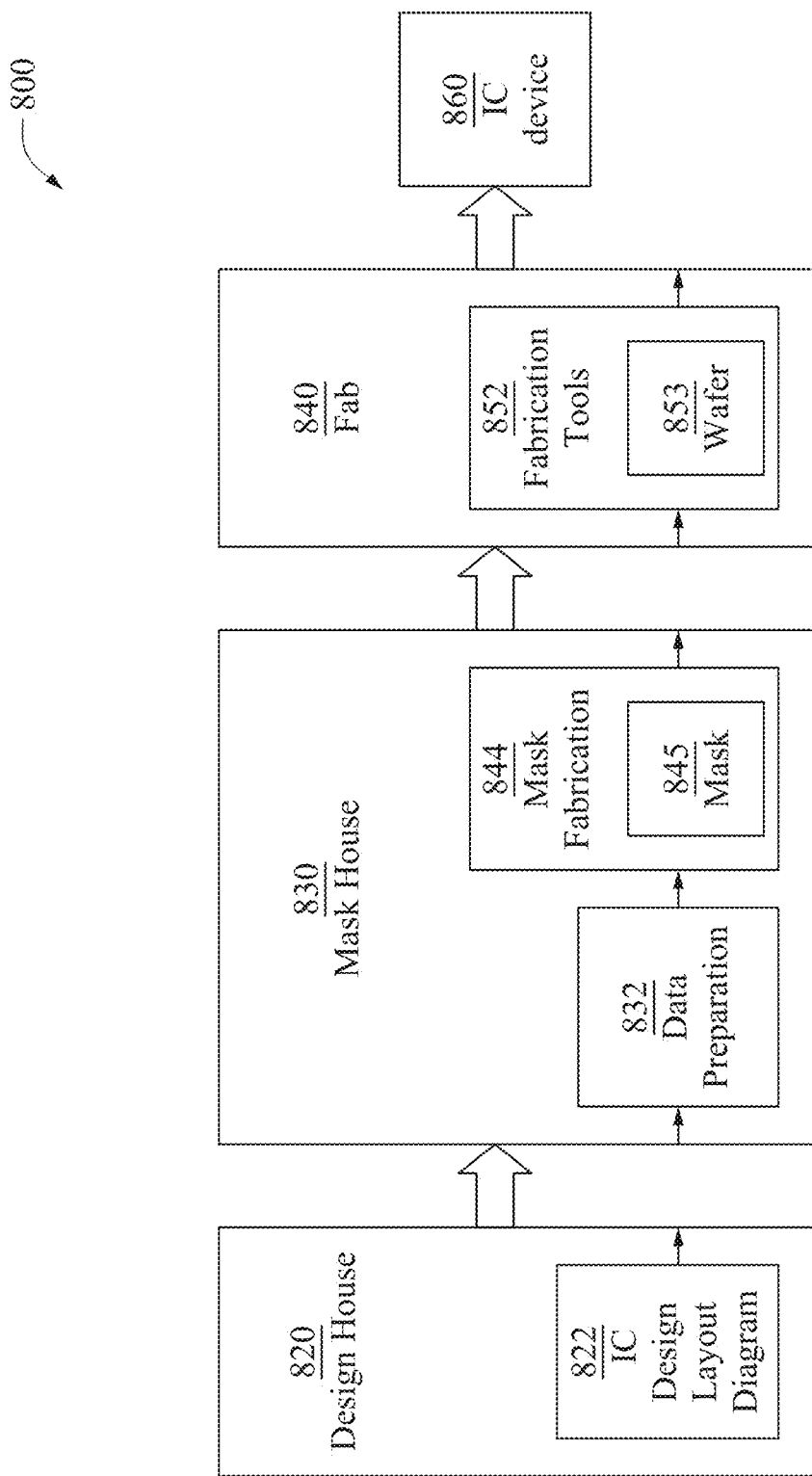
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram 500, 600A, 600B, or 600C discussed above with respect to FIGS. 5-6C4, designed for an IC device 860, e.g., IC device 100, discussed above with respect to FIGS. 1A-3G. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 10, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes wafer fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram includes overlapping a channel region of an upper transistor of a CFET in an IC layout with a gate region of the CFET, thereby defining a channel overlap region, positioning an isolation region in the IC layout, the isolation region including an entirety of the channel overlap region, intersecting the isolation region with a conductive region, and generating an IC layout diagram based on the IC layout. In some embodiments, defining the channel overlap region includes defining the channel overlap region between first and second S/D regions, and intersecting the isolation region with the conductive region includes overlapping each of the S/D regions with the conductive region. In some embodiments, intersecting the isolation region with the conductive region includes overlapping the isolation region with a gate via region of the conductive region, and overlapping each of the S/D regions with the conductive region includes overlapping each of the S/D regions with an S/D via region adjacent to the gate via region. In some embodiments, intersecting the isolation region with the conductive region includes overlapping the channel region with the conductive region. In some embodiments, positioning the isolation region includes the isolation region having a width equal to a width of the channel overlap region. In some embodiments, the method includes overlapping the gate region with a gate via region, the gate via region being offset from the channel overlap region. In some embodiments, positioning the isolation region includes the isolation region having a length greater than a length of the channel overlap region corresponding to a width of the channel region. In some embodiments, intersecting the isolation region with the conductive region includes the conductive region corresponding to a slot via structure.

In some embodiments, a method of generating an IC layout diagram includes overlapping a channel region of an upper transistor of a CFET in an IC layout with a gate region of the CFET, thereby defining a channel overlap region between first and second S/D regions of the upper transistor, positioning an isolation region in the IC layout, the isolation region including an entirety of the channel overlap region, intersecting the isolation region and each of the first and second S/D regions with a first conductive region, and generating an IC layout diagram based on the IC layout. In some embodiments, intersecting the isolation region and each of the first and second S/D regions with the conductive region includes the conductive region being coextensive with each of the first and second S/D regions. In some embodiments, the method includes overlapping the gate region and third and fourth S/D regions of a lower transistor of the CFET with a second conductive region, and overlapping the third S/D region and the second conductive region with a first via region. In some embodiments, the method includes overlapping the fourth S/D region and the second conductive region with a second via region. In some embodiments, the method includes overlapping the gate region with a third conductive region, wherein the second and third conductive regions are offset from the first conductive region in opposite directions, and overlapping the gate region and the third conductive region with a second via region. In some embodiments, the first conductive region at least partially defines a via structure of a manufacturing process corresponding to the IC layout diagram, and the second conductive region at least partially defines a metal segment in a first metal layer of the manufacturing process. In some embodiments, the upper transistor of the CFET is a first upper transistor of a first CFET, and intersecting the isolation region and each of the first and second S/D regions with the conductive region includes the first S/D region being included in a second upper transistor of a second CFET and the second S/D region being included in a third upper transistor of a third CFET.

In some embodiments, a method of generating an IC layout diagram includes overlapping a channel region of an upper transistor of a CFET in an IC layout with a gate region of the CFET, thereby defining a channel overlap region having a first dimension corresponding to a width of the channel region and a second dimension corresponding to a width of the gate region, positioning an isolation region in the IC layout, the isolation region including an entirety of the channel overlap region and having a third dimension across the channel region greater than the first dimension, intersecting the isolation region with a conductive region, and generating an IC layout diagram based on the IC layout. In some embodiments, intersecting the isolation region with the conductive region includes the conductive region having a fourth dimension across the channel region, smaller than the third dimension, and entirely inside the channel region. In some embodiments, intersecting the isolation region with the conductive region includes intersecting first and second S/D regions of the upper transistor with the conductive region, wherein the first and second S/D regions have a fifth dimension across the channel region greater than the first dimension. In some embodiments, the fifth dimension is greater than the third dimension. In some embodiments, generating the IC layout diagram including the IC layout includes generating the IC layout diagram corresponding to a transmission gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit (IC) layout diagram, the method comprising:
overlapping a channel region of an upper transistor of a complementary field-effect transistor (CFET) in an IC layout with a gate region of the CFET, thereby defining a channel overlap region;
positioning an isolation region in the IC layout, the isolation region including an entirety of the channel overlap region;
intersecting the isolation region with a conductive region; and
generating an IC layout diagram based on the IC layout.

2. The method of claim 1, wherein
the defining the channel overlap region comprises defining the channel overlap region between first and second source/drain (S/D) regions, and
intersecting the isolation region with the conductive region comprises overlapping each of the S/D regions with the conductive region.

3. The method of claim 2, wherein
the intersecting the isolation region with the conductive region comprises overlapping the isolation region with a gate via region of the conductive region, and
the overlapping each of the S/D regions with the conductive region comprises overlapping each of the S/D regions with an S/D via region adjacent to the gate via region.

4. The method of claim 1, wherein the intersecting the isolation region with the conductive region comprises overlapping the channel region with the conductive region.

5. The method of claim 1, wherein the positioning the isolation region comprises the isolation region having a width equal to a width of the channel overlap region.

6. The method of claim 1, further comprising overlapping the gate region with a gate via region, the gate via region being offset from the channel overlap region.

7. The method of claim 1, wherein the positioning the isolation region comprises the isolation region having a length greater than a length of the channel overlap region corresponding to a width of the channel region.

8. The method of claim 1, wherein the intersecting the isolation region with the conductive region comprises the conductive region corresponding to a slot via structure.

9. A method of generating an integrated circuit (IC) layout diagram, the method comprising:
overlapping a channel region of an upper transistor of a complementary field-effect transistor (CFET) in an IC layout with a gate region of the CFET, thereby defining a channel overlap region between first and second source/drain (S/D) regions of the upper transistor;
positioning an isolation region in the IC layout, the isolation region including an entirety of the channel overlap region;
intersecting the isolation region and each of the first and second S/D regions with a first conductive region; and
generating an IC layout diagram based on the IC layout.

10. The method of claim 9, wherein the intersecting the isolation region and each of the first and second S/D regions with the conductive region comprises the conductive region being coextensive with each of the first and second S/D regions.

11. The method of claim 9, further comprising:
overlapping the gate region and third and fourth S/D regions of a lower transistor of the CFET with a second conductive region; and
overlapping the third S/D region and the second conductive region with a first via region.

12. The method of claim 11, further comprising:
overlapping the fourth S/D region and the second conductive region with a second via region.

13. The method of claim 11, further comprising:
overlapping the gate region with a third conductive region, wherein the second and third conductive regions are offset from the first conductive region in opposite directions; and
overlapping the gate region and the third conductive region with a second via region.

14. The method of claim 11, wherein
the first conductive region at least partially defines a via structure of a manufacturing process corresponding to the IC layout diagram, and
the second conductive region at least partially defines a metal segment in a first metal layer of the manufacturing process.

15. The method of claim 9, wherein
the upper transistor of the CFET is a first upper transistor of a first CFET, and
the intersecting the isolation region and each of the first and second S/D regions with the conductive region comprises:
the first S/D region being included in a second upper transistor of a second CFET; and
the second S/D region being included in a third upper transistor of a third CFET.

16. A method of generating an integrated circuit (IC) layout diagram, the method comprising:
overlapping a channel region of an upper transistor of a complementary field-effect transistor (CFET) in an IC layout with a gate region of the CFET, thereby defining a channel overlap region having a first dimension corresponding to a width of the channel region and a second dimension corresponding to a width of the gate region;
positioning an isolation region in the IC layout, the isolation region including an entirety of the channel overlap region and having a third dimension across the channel region greater than the first dimension;
intersecting the isolation region with a conductive region; and
generating an IC layout diagram based on the IC layout.

17. The method of claim 16, wherein the intersecting the isolation region with the conductive region comprises:
the conductive region having a fourth dimension across the channel region, smaller than the third dimension, and entirely inside the channel region.

18. The method of claim 17, wherein the intersecting the isolation region with the conductive region further comprises:
intersecting first and second source/drain (S/D) regions of the upper transistor with the conductive region,
wherein the first and second S/D regions have a fifth dimension across the channel region greater than the first dimension.

19. The method of claim 18, wherein the fifth dimension is greater than the third dimension.

20. The method of claim 16, wherein the generating the IC layout diagram including the IC layout comprises generating the IC layout diagram corresponding to a transmission gate.

\* \* \* \* \*